(12) United States Patent
Watanabe et al.

(10) Patent No.: US 6,255,976 B1
(45) Date of Patent: Jul. 3, 2001

(54) LOW-FREQUENCY NOISE REMOVING METHOD AND A RELATED CMOS SENSING CIRCUIT

(75) Inventors: Takamoto Watanabe, Nagoya; Toshio Ikuta, Handa; Noboru Endo, Anjo, all of (JP)

(73) Assignee: Denso Corporation, Kariya-City (JP)

( * ) Notice: Subject to any disclaimer, the term of this patent is extended or adjusted under 35 U.S.C. 154(b) by 0 days.

(21) Appl. No.: 09/427,549

(22) Filed: Oct. 27, 1999

(30) Foreign Application Priority Data

Jan. 28, 1999 (JP) .................................................. 11-020397

(51) Int. Cl.[7] .............................. H03M 1/06; H03M 1/10; H03M 3/00
(52) U.S. Cl. ........................... 341/143; 341/118; 341/120
(58) Field of Search ..................................... 341/143, 118, 341/64, 120; 327/384, 96; 330/9

(56) References Cited

U.S. PATENT DOCUMENTS

| | | | | |
|---|---|---|---|---|
| 4,209,773 | * | 6/1980 | Everard | 341/64 |
| 4,948,992 | * | 8/1990 | Bukowski | 327/96 |
| 5,396,247 | | 3/1995 | Watanabe et al. | 341/157 |
| 6,008,685 | * | 12/1999 | Kunst | 327/512 |

FOREIGN PATENT DOCUMENTS

| | | |
|---|---|---|
| 5-259907 | 10/1993 | (JP) . |
| 9-264798 | 10/1997 | (JP) . |
| 10-339673 | 12/1998 | (JP) . |

* cited by examiner

*Primary Examiner*—Patrick Wamsley
(74) *Attorney, Agent, or Firm*—Pillsbury Winthrop LLP

(57) ABSTRACT

An intentional offset value is set beforehand. The intentional offset value is larger than a sensing objective signal "sig." A measuring device is provided for measuring the intentional offset value to obtain a measured intentional offset value "a" representing the quantity of the intentional offset value, and also for measuring a sum of the sensing objective signal "sig" and the intentional offset value to obtain a measured signal value "b" representing a summation of the quantity of the sensing objective signal and the quantity of the intentional offset value. A ratio (b/a) of the measured signal value to the measured intentional offset value is obtained. The obtained ratio is used as noise reducing data for reducing the noise involved in a sensor output.

38 Claims, 12 Drawing Sheets

(S=1.1, e=100)

| a | sigm | e/a | CORRECTED ERROR RATE | NON-CORRECTED ERROR RATE |
|---|---|---|---|---|
| 100 | 10 | 1 | 55 (%/FS) | 1000 (%/FS) |
| 1000 | 100 | 0.1 | 10 | 100 |
| 10000 | 1000 | 0.01 | 1 | 10 |
| 100000 | 10000 | 0.001 | 0.1 | 0 |
| 1000000 | 100000 | 0.0001 | 0.01 | 0.1 |

LOW-FREQUENCY NOISE REMOVING METHOD AND A RELATED CMOS SENSING CIRCUIT

BACKGROUND OF THE INVENTION

The present invention relates to a noise removing method which is applicable to a sensing circuit with a measuring means for measuring the signal quantity of a sensing objective signal representing a physical quantity or the like. Furthermore, the present invention relates to a CMOS sensing circuit including a CMOS element serving as a measuring device.

A sensing circuit, used for detecting the physical quantity such as pressure or acceleration, usually comprises a signal processing circuit for processing a sensing objective signal sent from a sensor transducer. One of conventional circuit components incorporated in the signal processing circuit is a bipolar transistor which is characteristic in that the internal noise is relative low.

According to this sensing circuit, the internal noise of the bipolar transistor is sufficiently small compared with a sensing objective signal. The influence of a noise component involved in the sensing objective signal is small and not troublesome. However, recent sensing circuits are required to reduce the cost, downsize the circuit scale, and smarten the sensing functions. For example, self diagnostic function and self correcting function are required for enhancing the intelligence of the sensing circuit. Furthermore, improvement of the digital signal processing function is required. Such recent requirements cannot be satisfied by a circuit arrangement including the bipolar transistor. It is therefore necessary to arrange the circuit as a CMOS circuit using a CMOS element which is capable of increasing the degree of integration.

In such a case, the sensing objective signal is processed by a measuring circuit. An interface, such as a CMOS amplification circuit (i.e., analog amplifier), is generally provided as a pre-stage interface for the measuring circuit. The measuring circuit is constituted by a CMOS element. The MOS transistor, constituting the CMOS amplification circuit, is subjected to 1/f noise which is very large. Thus, the internal noise (i.e., low-frequency noise) of the MOS transistor is large. The offset noise of the CMOS amplification circuit becomes large. The offset noise is the low-frequency noise of approximately 10 Hz or below, which overlaps with the frequency band of the sensing objective signal. This makes it difficult to remove the offset noise by using a filter circuit (i.e., a low-pass filter).

As described above, the CMOS sensing circuit is inevitably subjected to the offset noise involved in its signal processing system. The offset noise fluctuates at a low frequency. Meanwhile, a general sensing objective signal fluctuates at a low frequency too. When the offset noise is larger than the minimum level of the sensing objective signal, a finally obtained sensing output is greatly influenced by the noise. As a result, it becomes impossible to maintain the sensing accuracy at a required or satisfactory level. In addition, the offset voltage existing in a signal amplification circuit varies due to the aging. In this respect, this offset voltage is a sort of extra low-frequency noise. Similar problem will arise.

SUMMARY OF THE INVENTION

In view of the foregoing problems, the present invention has an object to provide a noise removing method applicable to a sensing circuit with a circuit element causing large internal noise. The noise removing method of the present invention makes it possible to effectively remove the low-frequency noise even when the internal noise level is larger than the minimum level of the sensing objective signal. Furthermore, the present invention has an object to provide a CMOS sensing circuit which is capable of removing the adverse influence of the low-frequency noise and is also capable of improving the sensing accuracy irrespective of the presence of a CMOS element.

In order to accomplish this and other related objects, the present invention provides a low-frequency noise removing method for removing a low-frequency noise having a noise component proportional to 1/f and $(1/f)^n$, where "f" represents a noise frequency and $n \geq 1$, which is applicable to a sensing circuit with an A/D conversion means for converting a signal quantity of a sensing objective signal. According to this noise removing method, an intentional offset value is set beforehand. The intentional offset value is set to be larger than the sensing objective signal. The intentional offset value is converted into digital data by the A/D conversion means to obtain intentional offset data representing the quantity of the intentional offset value. A sum of the sensing objective signal and the intentional offset value is converted into digital data by the A/D conversion means to obtain sensed signal data representing a summation of the quantity of the sensing objective signal and the quantity of the intentional offset value. Then, a ratio of the sensed signal data to the intentional offset data is obtained. And, the obtained ratio is used as noise reducing data (correction data) for reducing the low-frequency noise involved in a sensor output.

Obtaining the ratio of the sensed signal data to the intentional offset data is advantageous in that influence of the low-frequency noise can be suppressed by adequately setting the intentional offset value. The information corresponding to a significant digit number of the obtained ratio is used as the noise reducing data (correction data).

Another aspect of the present invention provides a noise removing method for a sensing circuit. According to this method, to remove the low-frequency noise in a sensing circuit with a measuring means for measuring the signal quantity of a sensing objective signal, an intentional offset value is set beforehand. The intentional offset value is larger than the sensing objective signal. First, the intentional offset value is measured by the measuring means to obtain a measured intentional offset value representing the quantity of the intentional offset value. Subsequently, a sum of the sensing objective signal and the intentional offset value is measured by the measuring means to obtain a measured signal value representing a summation of the quantity of the sensing objective signal and the quantity of the intentional offset value. The measuring order of these measuring operations can be reversed. Thereafter, a ratio of the measured signal value to the measured intentional offset value is obtained. And, the obtained ratio is used as noise reducing data for reducing the noise involved in a sensor output.

Accordingly, even when the sensing objective signal includes a low-frequency noise component, the same low-frequency noise component is involved in each of the measured intentional offset value and the measured signal value. As the intentional offset value is set to be larger than the level of the sensing objective signal, the influence of the low-frequency noise component involved in the noise reducing data is relatively small. The noise reducing data is a ratio of the measured signal value to the measured intentional offset value. The measured intentional offset value represents a measured value of the intentional offset value. The measured signal value represents a summation of the quantity of the sensing objective signal and the quantity of the intentional offset value. As a result, this method is applicable to the sensing circuit using a circuit element causing large internal noise. Even when the internal noise level becomes larger than the minimum level of the sensing objective signal, it becomes possible to effectively removing the low-frequency noise. Namely, by increasing the intentional offset value, it becomes possible to reduce the adverse influence of the low-frequency noise component involved in the noise reducing data of the sensor output. Thus, the sensing accuracy of the sensing circuit can be adequately maintained.

According to this method, it is preferable to successively perform a measuring operation for obtaining the measured intentional offset value and a measuring operation for obtaining the measured signal value. In this case, the measuring order of two measuring operations can be flexibly determined. This is advantageous in that, even when the noise has the quantity varying periodically at low frequency, each of the measured intentional offset value and the measured signal value includes the same low-frequency noise component. As a result, it becomes possible to prevent the noise reducing data, i.e., the ratio of the measured signal value to the measured intentional offset value, from varying due to the fluctuation of the low-frequency noise. Thus, the low-frequency noise can be effectively removed based on the noise reducing data.

According to this method, it is preferable to perform the measuring operation for obtaining the measured intentional offset value and the measuring operation for obtaining the measured signal value at a time interval which is sufficiently shorter than the period of the noise to be removed. This is advantageous in that, even when the noise to be removed has the quantity varying periodically at low frequency, each of the measured intentional offset value and the measured signal value includes the same low-frequency noise component. As a result, it becomes possible to prevent the noise reducing data, i.e., the ratio of the measured signal value to the measured intentional offset value, from varying due to the fluctuation of the low-frequency noise. Thus, the low-frequency noise can be effectively removed based on the noise reducing data.

According to this method, it is preferable to perform the measuring operation for obtaining the measured intentional offset value and the measuring operation for obtaining the measured signal value at a time interval equal to or smaller than $1/10$ of the period of the noise to be removed. This is advantageous in that the low-frequency noise component involved in each of the measured intentional offset value and the measured signal value can be suppressed within a predetermined level. As a result, it becomes possible to prevent the noise reducing data, i.e., the ratio of the measured signal value to the measured intentional offset value, from varying due to the fluctuation of the low-frequency noise. Thus, the low-frequency noise can be effectively removed based on the noise reducing data.

According to this method, it is preferable to repetitively perform the measuring operation for obtaining the measured intentional offset value to obtain a plurality of samples of the measured intentional offset value, and also repetitively perform the measuring operation for obtaining the measured signal value to obtain a plurality of samples of the measured signal value. An average of the plurality of samples of the measured intentional offset value is calculated, and an average of the plurality of samples of the measured signal value is calculated. Then, an average ratio of the averaged value of the measured signal value to the averaged value of the measured intentional offset value is obtained. The average ratio thus obtained is used as noise reducing data for reducing the noise involved in the sensor output. This is advantageous in that high-frequency noise components can be also reduced due to integration effect obtained by averaging the plurality of samples of the measured intentional offset value and also by averaging the plurality of samples of the measured signal value.

In this case, it is preferable to successively perform the repetitive measuring operations for obtaining the intentional offset value and the repetitive measuring operations for obtaining the measured signal value in this order or in the opposite order. This is advantageous in that the switching operation between the measuring objects is done only one time. Thus, the switching operation is simple.

According to this method, it is preferable to successively perform the measuring operation for obtaining the measured intentional offset value and the measuring operation for obtaining the measured signal value in this order or in the opposite order as a cycle to be repetitively performed. An average of a plurality of samples of the measured intentional offset value is calculated, and an average of a plurality of samples of the measured signal value is calculated. Then, an average ratio of the averaged value of the measured signal value to the averaged value of the measured intentional offset value is obtained. And, the average ratio thus obtained is used as noise reducing data for reducing the noise involved in the sensor output. This is advantageous in that high-frequency noise components can be also reduced due to integration effect obtained by averaging the plurality of samples of the measured intentional offset value and averaging the plurality of samples of the measured signal value. Especially, this method performs, as a set, the measuring operation for obtaining the measured intentional offset value and the measuring operation for obtaining the measured signal value. This is advantageous in that the low-frequency noise involved in the measured intentional offset value substantially agrees with the low-frequency noise involved in the measured signal value. Thus, it becomes possible to adequately maintain the low-frequency noise removing effect.

According to this method, it is preferable that the intentional offset value is larger than two times the signal quantity of the sensing objective signal. This is advantageous in that the adverse influence of the low-frequency noise component involved in the finally obtained noise reducing data can be suppressed within a practical level.

According to this method, it is preferable that the intentional offset value is equal to or larger than ten times a maximum value of the signal quantity of the sensing objective signal. This is advantageous in that the adverse influence of the low-frequency noise component involved in the finally obtained noise reducing data can be sufficiently suppressed.

According to this method, it is preferable that the intentional offset value is equal to or larger than the quantity of the noise to be removed. This is advantageous in that the adverse influence of the low-frequency noise component involved in the finally obtained noise reducing data can be suppressed within a practical level.

According to this method, it is preferable that the intentional offset value is produced from a signal producing means provided independent of an input circuit for the sensing objective signal. This is advantageous in that the measuring operation of the intentional offset value can be done without changing the condition of the input circuit for the sensing objective signal. Thus, the noise removing effect can be enhanced and, at the same time, the noise removing operation can be stabilized.

According to this method, it is preferable that the measuring means is for measuring signal quantities of a plurality of sensing objective signals. The measuring operation for obtaining the measured intentional offset value and the measuring operations for obtaining measured signal values corresponding to the plurality of sensing objective signals are performed in predetermined order so as to minimize an average of time intervals between the measuring operation for obtaining the measured intentional offset value and the measuring operations for obtaining respective measured signal values. This is advantageous in that the difference between low-frequency noise components involved in the measured values can be minimized. Thus, it becomes possible to enhance the noise reducing effect based on the finally obtained noise reducing data.

According to this method, it is preferable that the measuring means is for measuring signal quantities of a plurality of sensing objective signals. The measuring operation for obtaining the measured intentional offset value and the measuring operations for obtaining measured signal values corresponding to the plurality of sensing objective signals are performed in predetermined order so as to minimize a time interval between the measuring operation for obtaining the measured intentional offset value and the measuring operation for obtaining a measured signal value corresponding to a specific sensing objective signal giving the largest influence to the sensing accuracy. This is advantageous in that the low-frequency noise component involved in the measured signal value corresponding to the specific sensing objective signal giving the largest influence to the sensing accuracy can be substantially equalized to the low-frequency noise involved in the intentional offset value. Thus, it becomes possible to enhance the noise removing effect with respect to the specific sensing objective signal. As a result, the sensing accuracy of the sensing circuit can be increased.

To accomplish the above and other objects, the present invention provides a CMOS sensing circuit. According to this CMOS sensing circuit, a signal generating means is provided for generating an intentional offset value which is larger than the signal quantity of the sensing objective signal. A measuring means is provided for measuring the intentional offset value to obtain a measured intentional offset value representing the quantity of the intentional offset value, and for measuring a sum of the sensing objective signal and the intentional offset value to obtain a measured signal value representing a summation of the quantity of the sensing objective signal and the quantity of the intentional offset value. A data calculating circuit is provided for obtaining a ratio of the measured signal value to the measured intentional offset value (or, an opposite or reversed ratio of the measured intentional offset value to the measured signal value), and for using the obtained ratio as noise reducing data for reducing the noise involved in a sensor output.

Accordingly, even when the sensing objective signal includes a low-frequency noise component, the same low-frequency noise component is involved in each of the measured intentional offset value and the measured signal value. As the intentional offset value is set to be larger than the level of the sensing objective signal, the influence of the low-frequency noise component involved in the noise reducing data is relatively small. As a result, this is effectively applicable to the sensing circuit using a CMOS element causing large internal noise. Even when the internal noise level becomes larger than the minimum level of the sensing objective signal, it becomes possible to effectively removing the low-frequency noise. Namely, by increasing the intentional offset value, it becomes possible to reduce the adverse influence of the low-frequency noise component involved in the noise reducing data of the sensor output. Thus, the sensing accuracy of the sensing circuit can be adequately maintained.

According to this CMOS sensing circuit, it is preferable that the measuring means is for successively performing a measuring operation for obtaining the measured intentional offset value and a measuring operation for obtaining the measured signal value. In this case, the measuring order of two measuring operations can be flexibly determined. This is advantageous in that, even when the noise has the quantity varying periodically at low frequency, each of the measured intentional offset value and the measured signal value includes the same low-frequency noise component. As a result, it becomes possible to prevent the noise reducing data, i.e., the ratio of the measured signal value to the measured intentional offset value, from varying due to the fluctuation of the low-frequency noise. Thus, the low-frequency noise can be effectively removed based on the noise reducing data. The sensing accuracy of the CMOS sensing circuit can be adequately maintained.

According to this CMOS sensing circuit, it is preferable that the measuring means is for performing the measuring operation for obtaining the measured intentional offset value and the measuring operation for obtaining the measured signal value at a time interval which is sufficiently shorter than the period of the noise to be removed. This is advantageous in that, even when the noise to be removed has the quantity varying periodically at low frequency, each of the measured intentional offset value and the measured signal value includes the same low-frequency noise component. As a result, it becomes possible to prevent the noise reducing data, i.e., the ratio of the measured signal value to the measured intentional offset value, from varying due to the fluctuation of the low-frequency noise. Thus, the sensing accuracy of the CMOS sensing circuit can be adequately maintained.

In this case, it is preferable that the measuring means is for performing the measuring operation for obtaining the measured intentional offset value and the measuring operation for obtaining the measured signal value at a time interval equal to or smaller than $\frac{1}{10}$ of the period of the noise to be removed. This is advantageous in that the low-frequency noise component involved in each of the measured intentional offset value and the measured signal value can be suppressed within a predetermined level. As a result, it becomes possible to prevent the noise reducing data, i.e., the ratio of the measured signal value to the measured intentional offset value, from varying due to the fluctuation of the low-frequency noise. Thus, the sensing accuracy of the CMOS sensing circuit can be adequately maintained.

According to this CMOS sensing circuit, it is preferable that the measuring means is for repetitively performing the measuring operation for obtaining the measured intentional offset value to obtain a plurality of samples of the measured intentional offset value, and for repetitively performing the measuring operation for obtaining the measured signal value to obtain a plurality of samples of the measured signal value. The data calculating circuit is for calculating an average of the plurality of samples of the measured intentional offset value and an average of the plurality of samples of the measured signal value, for obtaining an average ratio of the averaged value of the measured signal value to the averaged value of the measured intentional offset value, and for using the average ratio as noise reducing data for reducing the noise involved in the sensor output. This is advantageous in that high-frequency noise components can be also reduced due to integration effect obtained by averaging the plurality of samples of the measured intentional offset value and also by averaging the plurality of samples of the measured signal value.

In this case, it is preferable that the measuring means is for successively performing the repetitive measuring operations for obtaining the measured intentional offset value and the repetitive measuring operations for obtaining the measured signal value in this order or in the opposite order. This is advantageous for the measuring means in that the switching operation between the measuring objects is done only one time. Thus, the switching operation is simple.

According to this CMOS sensing circuit, it is preferable that the measuring means is for successively performing the measuring operation for obtaining the measured intentional offset value and the measuring operation for obtaining the measured signal value in this order or in the opposite order as a cycle to be repetitively performed. The data calculating circuit is for calculating an average of a plurality of samples of the measured intentional offset value and an average of a plurality of samples of the measured signal value, for obtaining an average ratio of the averaged value of the measured signal value to the averaged value of the measured intentional offset value, and for using the average ratio as noise reducing data for reducing the noise involved in the sensor output. This is advantageous in that high-frequency noise components can be also reduced due to integration effect obtained by averaging the plurality of samples of the measured intentional offset value and averaging the plurality of samples of the measured signal value. Especially, the measuring means performs, as a set, the measuring operation for obtaining the measured intentional offset value and the measuring operation for obtaining the measured signal value. This is advantageous in that the low-frequency noise involved in the measured intentional offset value substantially agrees with the low-frequency noise involved in the measured signal value. Thus, it becomes possible to adequately maintain the low-frequency noise removing effect. Thus, the sensing accuracy of the CMOS circuit can be adequately maintained.

According to this CMOS sensing circuit, it is preferable that the signal generating means is for generating the intentional offset value which is larger than two times the signal quantity of the sensing objective signal. This is advantageous in that the adverse influence of the low-frequency noise component involved in the finally obtained noise reducing data can be suppressed within a practical level. The sensing accuracy of the CMOS circuit can be maintained at a practical level.

According to this CMOS sensing circuit, it is preferable that the signal generating means is for generating the intentional offset value which is equal to or larger than ten times a maximum value of the signal quantity of the sensing objective signal. This is advantageous in that the adverse influence of the low-frequency noise component involved in the finally obtained noise reducing data can be sufficiently suppressed. The sensing accuracy of the CMOS circuit can be improved sufficiently.

According to this CMOS sensing circuit, it is preferable that the signal generating means is for generating the intentional offset value which is equal to or larger than the quantity of the noise to be removed. This is advantageous in that the adverse influence of the low-frequency noise component involved in the finally obtained noise reducing data can be suppressed within a practical level. The sensing accuracy of the CMOS circuit can be maintained at a practical level.

According to this CMOS sensing circuit, it is preferable that an input circuit is provided for converting the sensing objective signal into a form suitable for the measuring operation performed by the measuring means. And, the signal generating means is provided independent of this input circuit. This is advantageous in that the measuring operation of the intentional offset value by the measuring means can be done without changing the condition of the input circuit for the sensing objective signal. Thus, the noise removing effect can be enhanced and, at the same time, the noise removing operation can be stabilized. The sensing accuracy of the CMOS circuit can be maintained adequately.

According to this CMOS sensing circuit, it is preferable that the measuring means is for measuring signal quantities of a plurality of sensing objective signals. The measuring operation for obtaining the measured intentional offset value and the measuring operations for obtaining measured signal values corresponding to the plurality of sensing objective signals are performed in predetermined order so as to minimize an average of time intervals between the measuring operation for obtaining the measured intentional offset value and the measuring operations for obtaining respective measured signal values. This is advantageous in that the difference between low-frequency noise components involved in the measured values can be minimized. Thus, it becomes possible to enhance the noise reducing effect based on the finally obtained noise reducing data. The sensing accuracy of the CMOS circuit can be maintained adequately.

According to this CMOS sensing circuit, it is preferable that the measuring means is for measuring signal quantities of a plurality of sensing objective signals. The measuring operation for obtaining the measured intentional offset value and the measuring operations for obtaining measured signal values corresponding to the plurality of sensing objective signals are performed in predetermined order so as to minimize a time interval between the measuring operation for obtaining the measured intentional offset value and the measuring operation for obtaining a measured signal value corresponding to a specific sensing objective signal giving the largest influence to the sensing accuracy. This is advantageous in that the low-frequency noise component involved in the measured signal value corresponding to the specific sensing objective signal giving the largest influence to the sensing accuracy can be substantially equalized to the low-frequency noise involved in the intentional offset value. Thus, it becomes possible to enhance the noise removing effect with respect to the specific sensing objective signal. As a result, the sensing accuracy of the CMOS sensing circuit can be increased.

According to this CMOS sensing circuit, it is preferable that an input circuit is provided for converting the intentional offset value into a voltage signal having a level representing the quantity of the intentional offset value and also for converting a sum of the sensing objective signal and the intentional offset value into a voltage signal having a level representing the summed-up quantities of the sensing objective signal and the intentional offset value. Each voltage signal thus converted is sent as a power supply voltage to a ring-gate delay circuit. The measuring means converts the entered voltage signals, i.e., the measured intentional offset value and the sum of the sensing objective signal and the intentional offset value, into corresponding digital data based on a pulse signal circulation frequency when a pulse signal is entered into the ring-gate delay circuit.

According to the A/D conversion circuit utilizing the above ring-gate delay circuit, it becomes possible to realize high resolution without increasing the circuit scale and also becomes possible to obtain a very wide A/D conversion range. The intentional offset value can be increased to a sufficiently large value. As a result, the sensing accuracy of the CMOS sensing circuit can be greatly increased. Furthermore, according to the measuring means utilizing the above ring-gate circuit, the A/D conversion speed can be greatly increased. The switching operation of the measuring objects can be quickly accomplished. As a result, it becomes possible to substantially equalize the low-frequency noise component involved in the measured intentional offset value with the low-frequency noise component involved in the measured signal value irrespective of the fluctuation of the low-frequency noise. Thus, as described previously, the low-frequency noise removing function can be surely obtained. Even when the measuring means detects signal quantities of a plurality of sensing objective signals, the switching operation of the measuring objects can be quickly accomplished. Thus, the present invention can be easily applicable to a sensing system detecting multiple or numerous sensing objective signals.

Another aspect of the present invention provides a noise removing method comprising the steps of converting a sensing objective signal into digital data to obtain sensing data, converting a referential objective value into digital data to obtain referential objective data, setting an intentional offset data larger than the sensing data, adding the intentional offset data to the sensing data to obtain a measured signal value, adding the intentional offset data to the referential objective data to obtain a measured intentional offset value, and obtaining a ratio of the measured signal value to the measured intentional offset value as correction result to be used for reducing the noise involved in a sensor output. This is advantageous in that the bit number required in the A/D conversion can be minimized. The A/D conversion time can be reduced. A/D conversion circuit can be downsized. The resolution required in the A/D conversion can be moderated.

Preferably, the referential objective data is equivalent to an A/D conversion value obtained when the sensing objective signal is substantially 0. This setting is effective to enhance the noise removing effect when the sensing objective signal is 0.

Alternative, it is preferable that the referential objective data is equivalent to an A/D conversion value obtained when the sensing objective signal is substantially 50% of its maximum value. This is effective to prevent the noise removing effect from deteriorating in the edge regions corresponding to the minimum and maximum values of the sensing objective signal.

The sensing data and the referential objective data may comprise noise data causing a measuring error. In this case, it is preferable that the intentional offset data is larger than the sensing data.

The noise data may be an A/D conversion value of a noise component involved in each of the sensing objective signal and the referential objective value. In this case, it is preferable that the noise component is equivalent to or larger than the resolution in the A/D conversion. For example, the noise component and the resolution of the A/D conversion are in a level of $\mu V$.

The noise component may be a frequency noise component proportional to $1/f$ and $(1/f)^n$, where $n \geq 1$ and "f" is a noise frequency not larger than 10 Hz. The noise data may be an A/D conversion value of a noise component which is added to each of the sensing objective signal and the referential objective value when the sensing objective signal and the referential objective value are amplified by an amplification circuit using a transistor, such as a bipolar transistor, a compound transistor (HBT, HEMT etc).

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
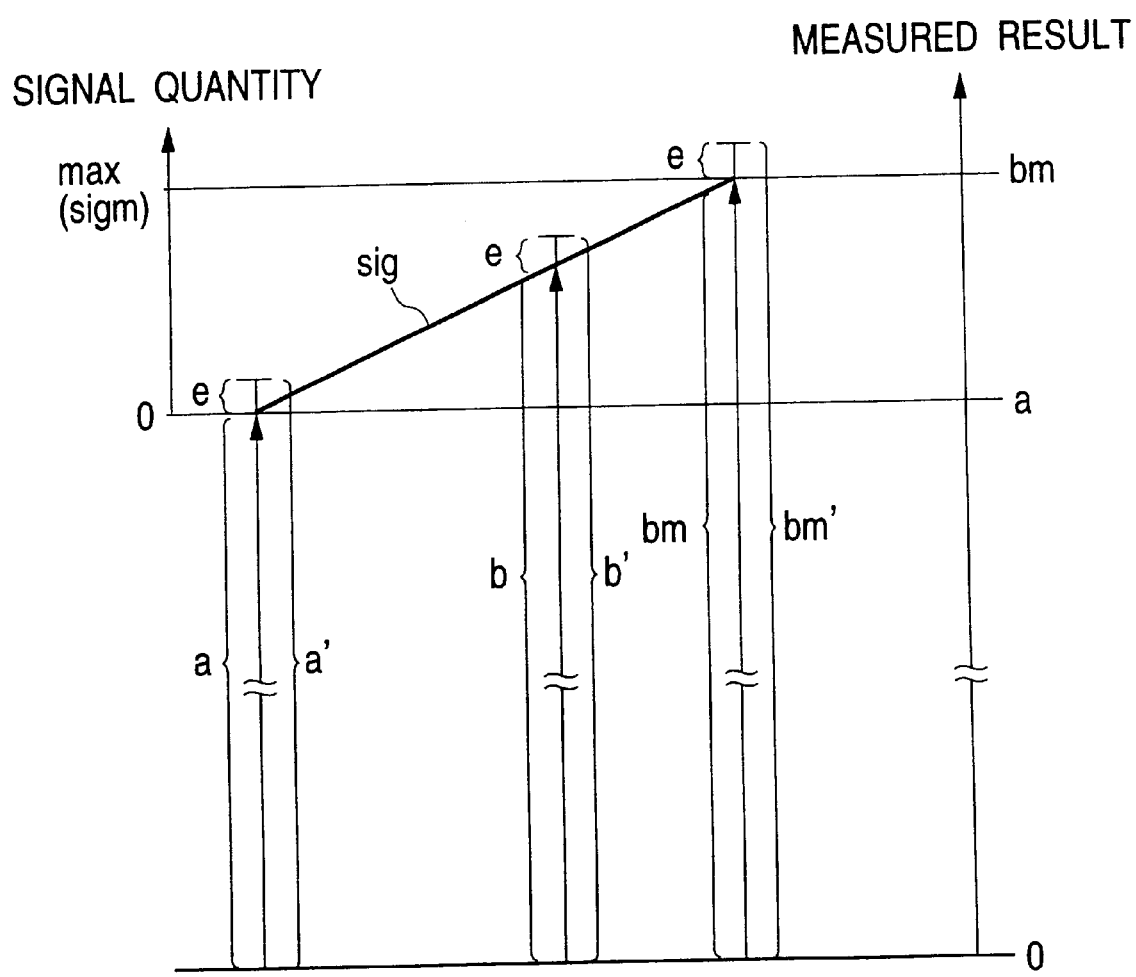
FIG. 1 is a characteristic view showing the fundamental principle of the noise removing method in accordance with a preferred embodiment of the present invention.

Preferred embodiments of the present invention will be explained hereinafter with reference to attached drawings. Identical parts are denoted by the same reference numerals throughout the views.

Hereinafter, a preferred embodiment of the present invention will be explained with reference to FIGS. 1 to 11.

FIG. 1 is a characteristic view showing the fundamental principle of the present invention. A sensing objective signal "sig" sent from a sensor transducer has the signal quantity (e.g., a voltage level) linearly varying from 0 to a maximum value "max." This maximum value is referred to "sigm" in the following description. The correction processing for removing the noise component involved in the sensing objective signal "sig" is performed in the following manner.

To perform the correction processing, this embodiment sets an intentional offset value beforehand. The intentional offset value is larger than the sensing objective signal "sig." FIG. 1 shows a measured intentional offset value "a" as a measured result of the intentional offset value which is measured by a measuring means which is provided for measuring the signal amount of a sensing objective signal "sig." Furthermore, FIG. 1 shows a measured signal value "b" as a measure result of a summed-up signal representing a summation of the sensing objective signal "sig (0 to max)" and the intentional offset value. The measured signal value "b" is also measured by the measuring means. The maximum value of the measured signal value "b" is represented by "bm (=sigm+a)". In FIG. 1, "e" represents an offset noise in the signal processing system.

The correction processing may be performed by using an arrangement capable of accomplishing the intentional offset value measuring operation and the summed-up signal measuring operation within a sufficiently short time. In this case, it is believed that the noise component "e" of a same level is involved in each of the measured intentional offset value "a" and the measured signal value "b." Needless to say, such an arrangement is not necessary when the offset noise "e" is a D.C. component due to dispersion in the manufacturing process or the like.

The measured intentional offset value "a" involving the noise "e" is referred to as "a'(=a+e)." The measured signal value "b" involving the noise component "e" is referred to as "b'(=b+e)." The ratio of b' to a' is used as correction data S' (=b'/a') for reducing the noise component. The correction data S' for the maximum value "sigm" of the sensing objective signal "sig" is represented by b'm/a'. In this case, the value "b'm" is the maximum value of the measured signal value "b" involving the noise "e." When no noise "e" is involved, an ideal data ratio is obtained as S(=b/a).

Then, a true signal component "sig" is obtained by subtracting an intentional offset component (e.g., 1 when a=b (i.e., sig=0)) from a finally obtained value. In this case, the influence of the noise "e" is reduced to a level of "e/a." Accordingly, the noise removing effect can be obtained.

Figure 2:
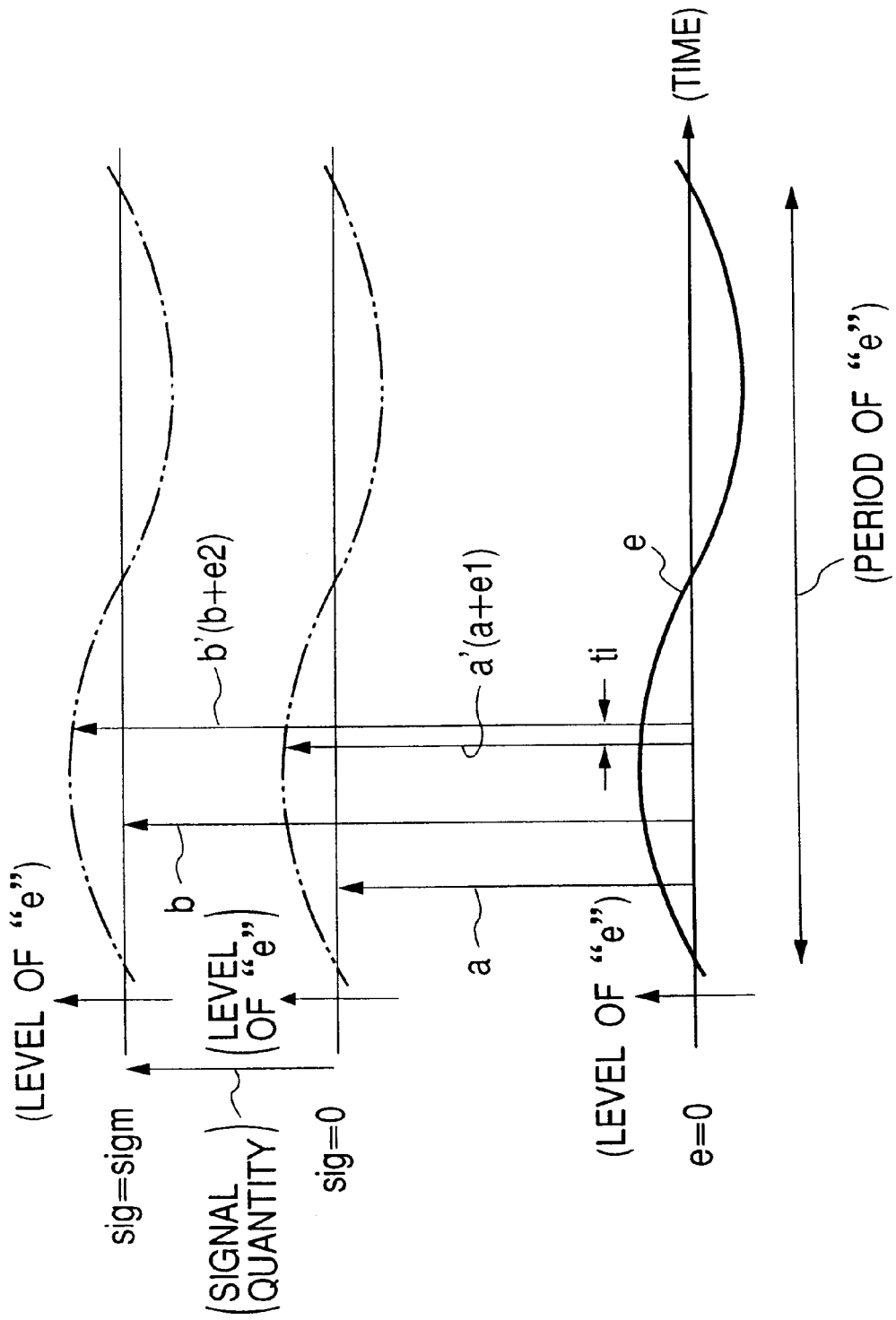
FIG. 2 is a signal waveform view illustrating the measuring timing for each of the measured signals.

FIG. 2 is a signal waveform view showing the measuring timing for each of the measured signals, i.e., the intentional offset value with respect to the low-frequency noise "e" and the summed-up signal representing the summation of the sensing objective signal "sig" and the intentional offset value. The measured intentional offset value "a" involving the noise "e(=e1)" is represented by a'(=a+e1). The measured signal value "b" involving the noise "e(=e2)" is represented by b'(=b+e2). In the following explanation, the maximum value of the noise "e" is represented by "em." as described previously, the maximum value of the sensing objective signal "sig" is represented by "sigm" and the maximum value of the measured signal value "b" is represented by "bm."

As shown in FIG. 2, the noise "e" varies at a low frequency. The measuring operation of the intentional offset value and the measuring operation of the summed-up signal (i.e. the summation of the sensing objective signal "sig" and the intentional offset value) may be successively performed at a time interval "ti" which is sufficiently shorter than the period of the noise "e." In this case, it is regarded that the noise "e" remains at a substantially same value (e=e1=e2). Accordingly, the measured intentional offset value "a" and the measured signal value "b" are expressed as described previously; i.e., a'=a+e, and b'=b+e.

Hereinafter, considering the above-described fundamental principle, the correction processing of the present invention will be explained. The correction processing of the present invention utilizes the intentional offset value to reduce the noise component. The correction data S' is the ratio of the measured signal value b'(=b+e) to the measured intentional offset value a' (=a+e).

$$S'=b'/a'=(b+e)/(a+e) \quad (1)$$

When the noise "e" is 0, the above ratio is referred to as an ideal ratio S (=b/a). The equation (1) can be rewritten by entering the relationship b=Sa obtained from the ideal ratio S.

$$S'=S/(1+e/a)+1/(1+a/e) \quad (2)$$

Accordingly, when "e/a" approaches to 0 (i.e., when "a/e" increases), the correction data S' approaches to the ideal ratio S. The error is minimized. Namely, the noise reduction effect is very large. In other words, the error can be minimized when the difference S'−S approaches 0. The difference S'−S is referred to as "εa."

$$\varepsilon a=S'-S=(1-S)/\{1+(a/e)\} \quad (3)$$

Accordingly, when the ideal ratio S approaches to 1, the error εa decreases. Furthermore, like the conclusion derived from the equation (2), the error reduction effect is very high when "a/e" increases (i.e., "e/a" approaches to 0).

Furthermore, as an index showing the error reducing effect, an error rate εr is defined in the following manner.

$$\varepsilon r=\varepsilon a/(Sm-S0)$$

where (Sm−S0) represents a maximum variation rate of the ideal ratio S(Sm=bm/a=(sigm+a)/a, and S0=b/a corresponding to sig=0, i.e., S0=1).

Thus, the relationship Sm−S0=sigm/a is obtained. From the relationship defined by the equation (3), εr is redefined in the following manner.

$$\varepsilon r=(1-S)\cdot(1/sigm)\cdot[1/\{(1/e)+(1/a)\}] \quad (4)$$

When the relationship e<<a is established in the equation (4), 1/a is substantially zero.

$$\varepsilon r=(1-S)\cdot e/sigm \quad (5)$$

The term e/sigm in the equation (5) is an error rate obtained when no correction processing is performed. This embodiment performs the correction processing by setting the intentional offset value. Thus, the value of (1−S) determines the quantity of the error rate εr and accordingly the improved rate of the S/N ratio in the sensor circuit.

In short, to enhance the noise reduction effect for reducing the noise component involved in the sensing objective signal "sig", the intentional offset value must be sufficiently large compared with the amplitude of the sensing objective signal "sig" and the noise level. In other words, when the intentional offset value is relatively small, S may become larger than 2. In such a case, the absolute value of (1−S) exceeds 1 as apparent from the equation (5). The error rate εr increases. No noise reduction effect can be expected. The low-frequency nose, to be removed, has the quantity slowly varying. When there is a large interval between a measuring point for the measured intentional offset value "a" and a measuring point for the measured signal value "b", it becomes difficult to regard the noise "e" involved in the measured value "a" as being substantially identical with the noise "e" involved in the measured value "b." The realized noise removing effect will be insufficient. In view of the above, it is important to shorten the interval between the measuring point for the measured intentional offset value "a" and the measuring point for the measured signal value "b" to a satisfactory level.

In a practical example, the sensing objective signal "sig" can be measured as digital data and processed in a processing circuit. When the maximum value "sigm" of the sensing objective signal "sig" is 10,000 (i.e., sig=0 to 10,000), the intentional offset value may be set so as to obtain the measured intentional offset value "a" equal to ten times the "sigm", i.e., 100,000. The maximum value "sigm" of the sensing objective signal "sig" involving the intentional offset value is measured as the measured signal value "bm"(=b). The measured signal value "bm" (=b) becomes 110,000.

It is now supposed that the maximum value "em" of the noise "e" is 100 and the interval of the above-described measuring operations is sufficiently short.

$$S=b/a=bm/a=1.1$$

$$e/a=em/a=0.001$$

$$e1=e2=e$$

In this case, the error rate $\epsilon'$ obtained when no correction processing is performed is defined in the following manner.

$$\epsilon'=e/sigm=100/10,000=0.01(=1\%/FS)$$

Namely, an error level of $\frac{1}{100}$ will be caused in the full scale of the sensing objective signal "sig."

On the other hand, according to the correction processing utilizing the intentional offset value, the error rate $\epsilon r$ is obtained by entering S=1.1 into the equation (5).

$$\epsilon r=(1-1.1)\cdot 100/10,000=-0.001(=0.1\%/FS)$$

Namely, in the full scale of the sensing objective signal "sig", the error can be suppressed to the level of $\frac{1}{1,000}$, i.e., $\frac{1}{10}$ of the error involved in the case where no correction processing is performed.

In the above explanation, the sensing objective signal "sig" is directly added to the intentional offset "a." However, it is possible to add $\pm\frac{1}{2}$ of the sensing objective signal "sig" to the intentional offset value. As a whole, the error rate can be reduced. By selecting the adding condition of the sensing objective signal "sig" to the intentional offset value, it becomes possible to optimize the error reduction effect.

Figures 3, 4:
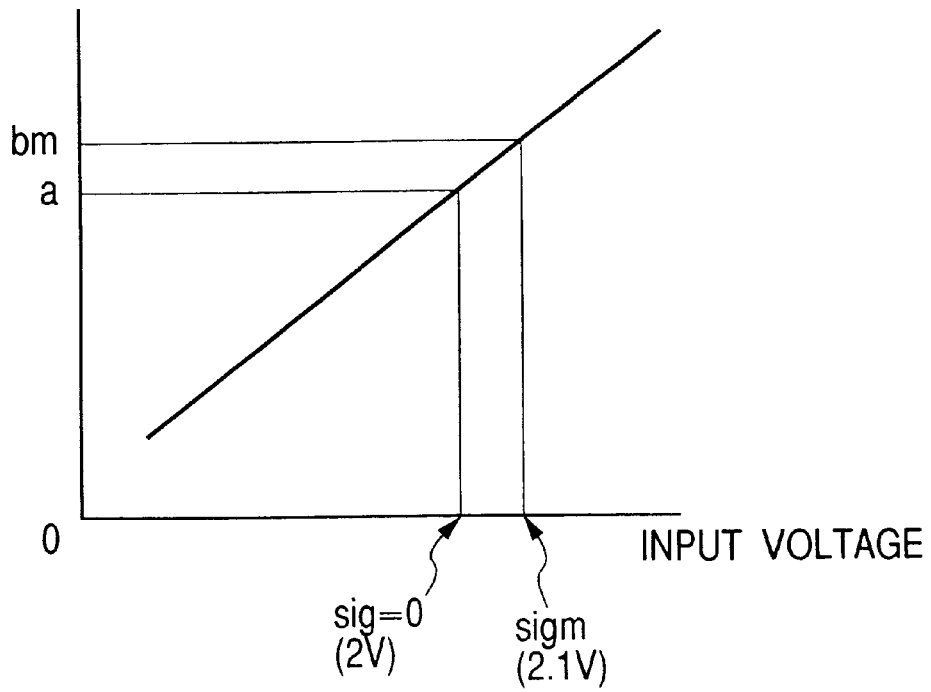
FIG. 3 is a graph showing the error rates in relation to various data of the measured intensional offset value and various maximum values of the sensing objective signal under predetermined conditions.
FIG. 4 is a graph showing the conversion characteristics of a sensor A/D conversion circuit.

FIG. 3 shows the "e/a" value, the error rate obtained through the correction processing, and the error rate obtained through no correction processing in relation to various data of the measured intentional offset value "a" and the maximum value "sigm" of the sensing objective signal "sig" under the condition S=1.1 and e=100. FIG. 3 shows that the correction processing brings the improved effect equivalent to a single digit in the error rate. The S/N ratio of the sensing circuit can be improved to the order of a single digit. In this case, when the value of S(=b/a) is less than 2, the error rate $\epsilon r$ reduces to a practically acceptable level. The correction processing effect is obtained. When the value of S is equal to or less than 1.1, the S/N ratio of the sensing circuit can be improved by the rate of e/a. The value S=1.1 corresponds to the condition where the intentional offset value is 10 times the maximum value of the sensing objective signal "sig" (i.e., e<<a). Accordingly, when the error level (i.e., offset noise level) is constant, the S/N ratio can be greatly improved by increasing the intentional offset value.

In short, the intentional offset value is predetermined so as to have a value larger than the sensing objective signal "sig." The correction data S' (=b'/a') is obtained by using the intentional offset value. By using thus obtained correction data S', the correction processing is performed as described above. Even when the sensing objective signal "sig" includes the low-frequency noise "e", each of the measured intentional offset value "a" and the measured signal value "b" includes the same low-frequency noise component. As the intentional offset value is larger than the level of the sensing objective signal "sig", the adverse influence of the low-frequency noise component involved in the correction data S' is relatively small.

As a result, the low-frequency noise components can be effective removed even when the internal noise level becomes larger than the minimum level of the sensing objective signal "sig" when the circuit arrangement is constituted by using a circuit element, such as a CMOS element, having larger internal noise. Accordingly, when the intentional offset value becomes large, the adverse influence of the low-frequency noise component involved in the correction data S' of the sensor output can be reduced. Thus, it becomes possible to adequately maintain the sensing accuracy of the sensing circuit. When the intentional offset value exceeds two times the signal quantity (i.e., the voltage value in this embodiment) of the sensing objective signal "sig", it becomes possible to suppress the adverse influence of the low-frequency noise component involved in the finally obtained correction data S' to an actually acceptable level.

When the intentional offset value is equal to or larger than ten times the maximum signal amount of the sensing objective signal "sig", it becomes possible to surely eliminate the adverse influence of the low-frequency noise component involved in the correction data S'. The sensing accuracy of the sensing circuit can be greatly improved. Furthermore, when the intentional offset value is equal to or larger than the quantity of the noise "e" to be removed, it becomes possible to suppress the adverse influence of the low-frequency noise component involved in the finally obtained correction data S' to an actually acceptable level. The offset voltage existing in a signal amplification circuit varies due to the aging. In this respect, this offset voltage is a sort of extra low-frequency noise. It is apparent that such low-frequency noise can be removed by employing the above-described noise removing method.

When both the sensing objective signal "sig" and the noise to be removed exist in the same frequency band, the conventional filters cannot be used to improve the S/N ratio. However, the correction processing of the present invention utilizes the intentional offset value larger than the objective signal "sig" so as to surely remove the noise components. The magnificent effects are obtained.

As described above, the measuring operation of the intentional offset value and the measuring operation of the summed-up signal (i.e. the summation of the sensing objective signal "sig" and the intentional offset value) may be performed at the time interval "ti" which is sufficiently smaller than the frequency of the low-frequency noise "e." For example, these measuring operations may be successively performed. Or, the interval of the measuring operations may be set to a value sufficiently shorter than the frequency of the noise to be removed. In such cases, even when the noise (i.e., the low-frequency noise) involved in the sensing objective signal "sig" varies periodically, each of the measured intentional offset value "a" and the measured signal value "b" includes the same low-frequency noise component. Thus, it becomes possible to prevent the correction data S' (=a'/b') from varying in response to the fluctuation of the low-frequency noise. The low-frequency noise can be effectively removed based on the correction data S'. Especially, when the interval between the above-described measuring operations is equal to or less than 1/10 of the period of the noise to be removed, it becomes possible to surely suppress the level of the low-frequency noise involved in each of the measured intentional offset value "a" and the measured signal value "b" to a predetermined level. Thus, the low-frequency noise components can be surely removed.

For example, the noise components can be removed from the sensing objective signal "sig" in the following manner. First, an offset noise value is measured when the sensing objective signal "sig" is equal to a standard value (e.g., 0 or a fixed value close to 0). Immediately after the offset noise value is measured, the value of the sensing objective signal "sig" is measured. Then, the error correction is performed by subtracting the above offset noise value from the measured value. However, in an actual sensing circuit, it is very difficult to prepare the above-described standard value as an accurate value. It is therefore very difficult to accurately measure the offset noise value at the time when the sensing objective signal "sig" becomes equal to the standard value. Accordingly, satisfactory result cannot be obtained as the noise removing effect. A signal source is necessary for generating the standard value and also a means for selectively effecting this signal source is necessary. Some objects to be detected may require an actuator or a mechanical switch, additionally. The cost reduction and the downsizing cannot be realized. In this respect, the above-described noise removing method cannot be realized. On the other hand, the noise removing method in accordance with the embodiment of the present invention is free from such problems. Thus, in practice, the present invention is very useful.

Especially, an analog sensing circuit using a CMOS element is subjected to the internal noise (i.e., low-frequency noise) derived from the 1/f noise. To suppress the noise level involved in the sensing objective signal "sig", increasing the circuit area (i.e., chip area) is conventionally done to suppress the 1/f noise. However, the realized noise reduction level was insufficient due to cost and size restrictions. On the other hand, the noise removing method in accordance with the embodiment of the present invention is applicable to the removal of the low-frequency noise derived from the 1/f noise. When the present invention is employed in the CMOS sensing circuit, the sensing accuracy can be improved. Accordingly, the present invention can be easily incorporated into a CMOS digital circuit. This greatly contributes the smartening of the sensing circuit. Furthermore, when the sensing circuit employs the arrangement of the present invention combined with the CMOS digital circuit, the overall circuit arrangement can be easily downsized in connection with the fine process technique. This is very advantageous in both the cost reduction and the downsizing.

The noise removing method in accordance with the embodiment of the present invention is conceptually applicable to both of the analog signal processing and the digital signal processing. However, in the practical analog signal processing, an effective range of the input signal level is narrowed by a voltage amount corresponding to the intentional offset value. When the analog signal processing circuit uses a power supply voltage of 5V, the effective signal range is 0 to 5V. However, the intentional offset value may be set to a value equal to 10 times the maximum value of the sensing objective signal "sig." In this case, the effective signal range is limited to a very narrow range of 0 to 0.45V. Thus, it is preferable to apply the present invention to the digital signal processing.

Hereinafter, a practical example of the digital signal processing will be explained. First, as apparent from the equations (3) and (5), when the ideal ratio S approaches 1, the S/N ratio improvement effect can be enhanced. Namely, when the intentional offset value (the measured intentional offset value "a") is larger than the level (maximum variation width) of the sensing objective signal "sig", the S/N ratio improvement effect can be enhanced. Furthermore, when the intentional offset value is larger than the amplitude of the noise "e", the S/N ratio improvement effect can be enhanced.

Accordingly, it is preferable to enlarge the intentional offset value as much as possible. To this end, one of conditions to be satisfied is that an A/D conversion circuit serving as a measuring means has sufficiently high resolution and a wide measuring range. Namely, the function of the A/D conversion circuit required for the digital signal processing is to perform the A/D conversion by using the required number of bits even when the signal effective range is small, and to perform the A/D conversion so as to cover the range of the intentional offset value which is set to be sufficiently larger than the signal effective range.

For example, in the A/D conversion circuit, a dynamic range of 14 or more bits will be required when the signal sensing resolution is set to a general level of 10 bits. The A/D converter satisfying these requirements is, for example, a $\Delta\Sigma$ modulation-type A/D converter (a $\Delta\Sigma$ analog to digital converter). According to this converter, past data must be successively held. This makes it difficult to speedily switch the measuring operation of the measured intentional offset value "a" and the measuring operation of the measured signal value "b." To solve this problem, it may be possible to use two series of $\Delta\Sigma$ modulation-type A/D converters. However, according to this arrangement, the pre-stage amplifier must be commonly used. The complicated control is necessary for holding the above data. Furthermore, the circuit scale is doubled. The cost reduction is difficult.

To solve the above problems, it is preferable to employ an A/D conversion circuit (hereinafter, referred to a sensor A/D conversion circuit) disclosed in the U.S. Pat. No. 5,396,247 corresponding to the European Patent 561 331. FIG. 4 is a graph schematically showing the conversion characteristics of the sensor A/D conversion circuit. In FIG. 4, the input voltage corresponding to the intentional offset value is 2V (the point of sig=0), and the variation range of the sensing objective signal "sig" (0 to sigm) is 100 mV which is equivalent to the maximum output voltage of a general sensing (element) circuit, such as a piezoelectric-resistance bridge circuit. As the above sensor A/D conversion circuit has the very high voltage resolution equivalent to 10 $\mu$V, it becomes possible to divide the component of the sensing objective signal "sig" into a total of 10,000 sections (equivalent to 14 bits in the resolution). At the same time, the component of the intentional offset value can be divided into a total of 100,000 sections (equivalent to 17 bits in the resolution). Furthermore, the sensor A/D conversion circuit needs not hold the past data. Thus, the sensor A/D conversion circuit can easily and quickly switch the measuring operations for a plurality series of input signals. Furthermore, the sensor A/D conversion circuit can be entirely constituted as a digital circuit. This is advantageous in both the cost reduction and the downsizing.

Figure 5:
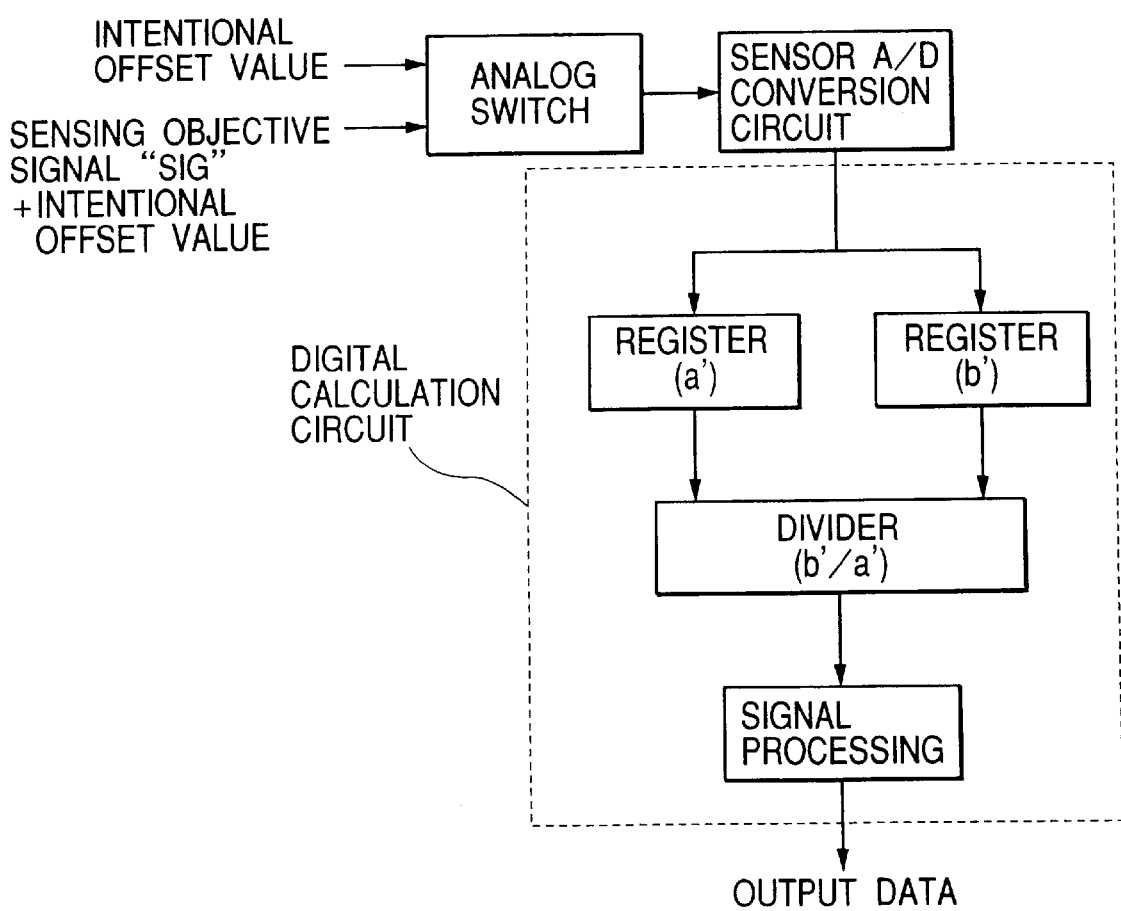
FIG. 5 is a block diagram showing a schematic arrangement of a signal processing circuit which is used to removing the noise.

FIG. 5 is a block diagram showing a schematic arrangement of a signal processing circuit employing the above sensor A/D conversion circuit for removing the noises. The signal processing circuit shown in FIG. 5 is a digital calculation circuit equivalent to a stack memory 12 and a correction circuit 14 in a later-described CMOS sensing circuit shown in FIG. 6. According to the arrangement shown in FIG. 5, an analog switch performs a predetermined switching operation for selectively inputting an input signal having a voltage value corresponding to the intentional offset value and an input signal having a voltage value corresponding to a summation of the sensing objective signal "sig" and the intentional offset value. The selected signal is converted into digital data by the sensor A/D conversion circuit. Through such A/D conversion operation, the measured intentional offset value a' and the measured signal value b', each including the noise "e" (including the DC noise component), are obtained. Both of the measured values a' and b' are sent to a post-stage digital calculation circuit and stored in respective registers. The digital calculation circuit includes a divider which performs the correcting calculation for obtaining the correction data S' (=b'/a'). And, the signal processing for removing the noise components is performed based on the correction data S'. The above-described digital calculation is feasible by using a general circuit, such as a microcomputer. Furthermore, it is possible to use a dedicated digital calculation circuit formed on the chip of the sensor A/D conversion circuit.

Figure 6:
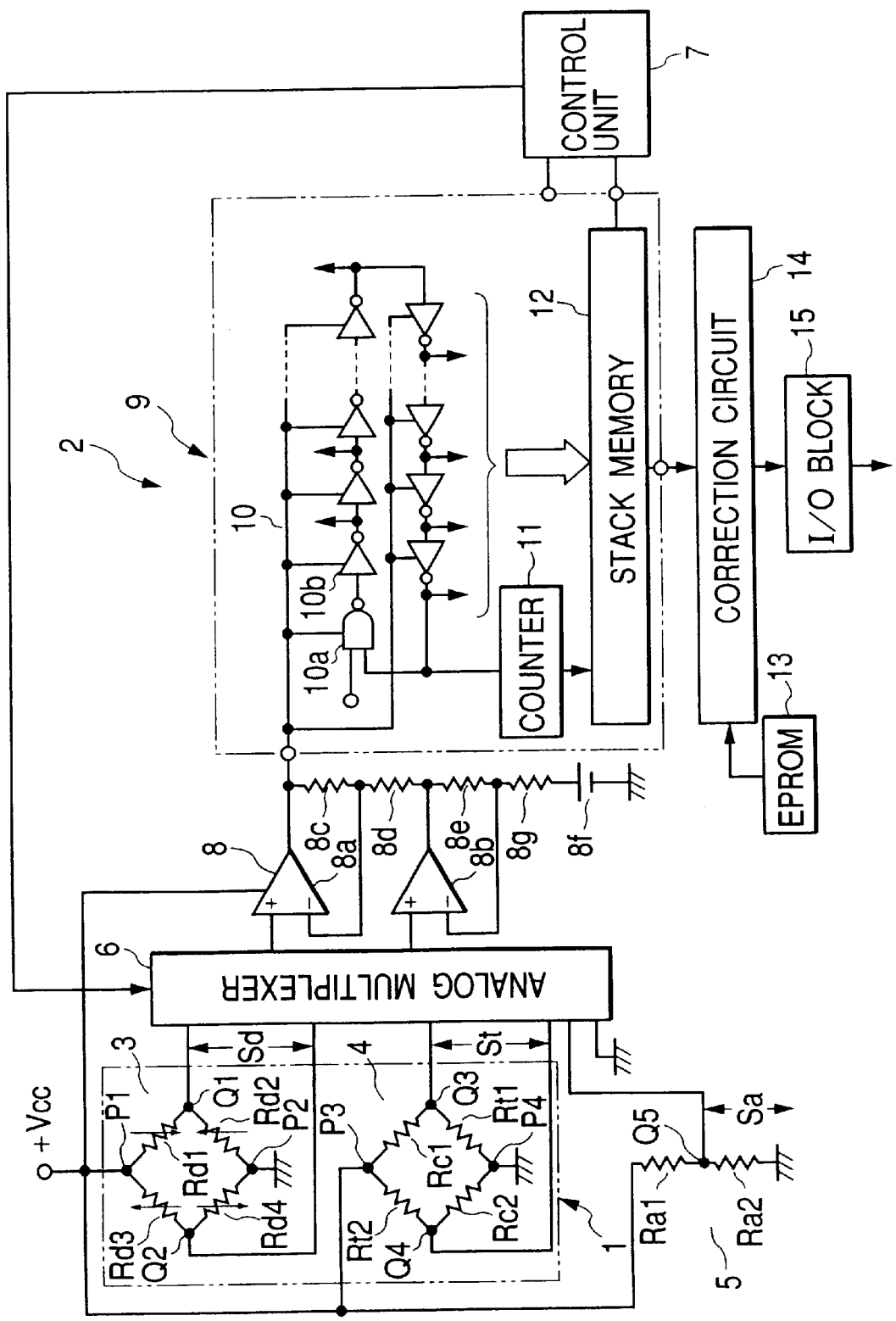
FIG. 6 is a circuit diagram showing an overall arrangement of a CMOS sensing circuit.
Figure 7:
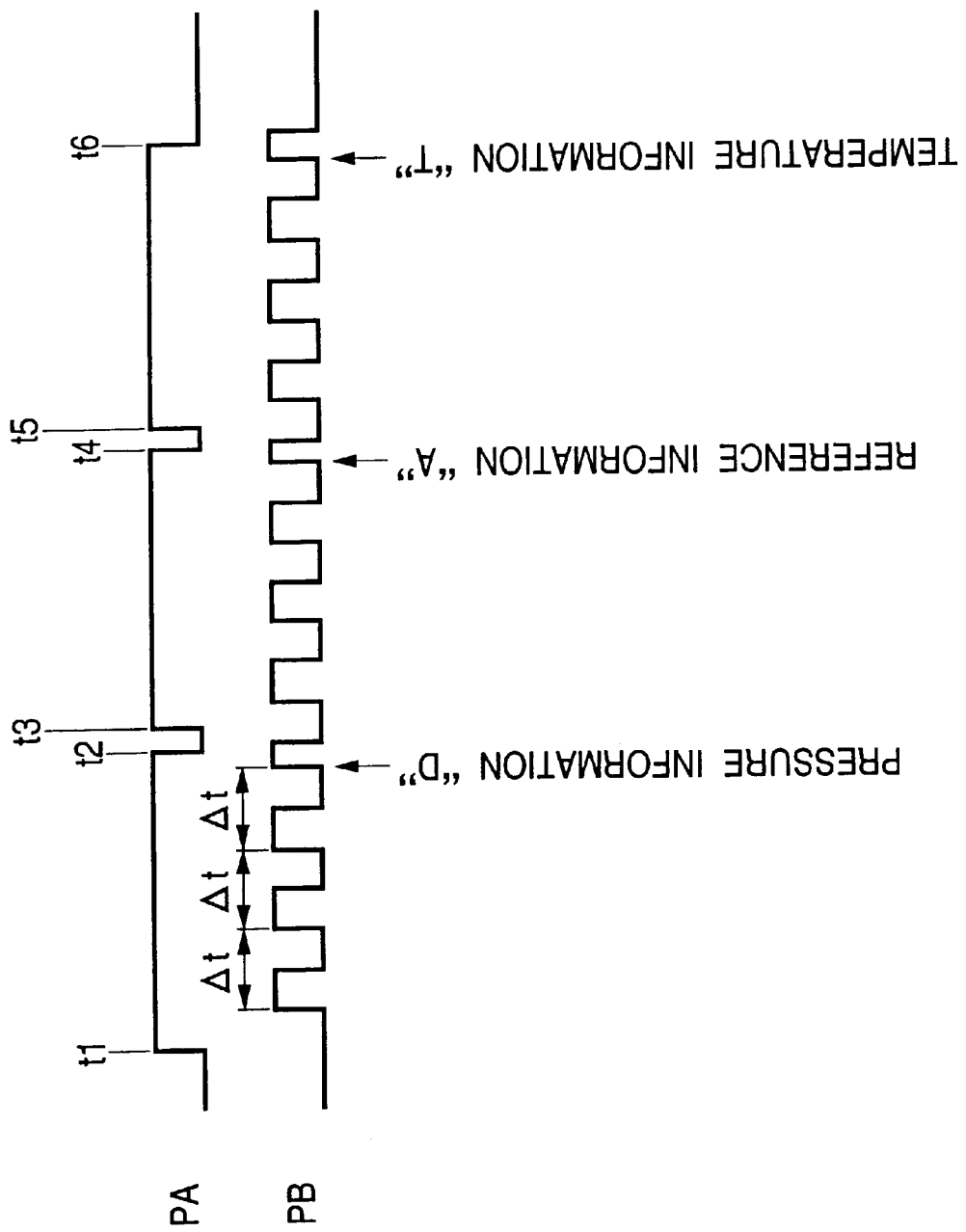
FIG. 7 is a time chart illustrating the operation of the CMOS sensing circuit.
Figure 8:
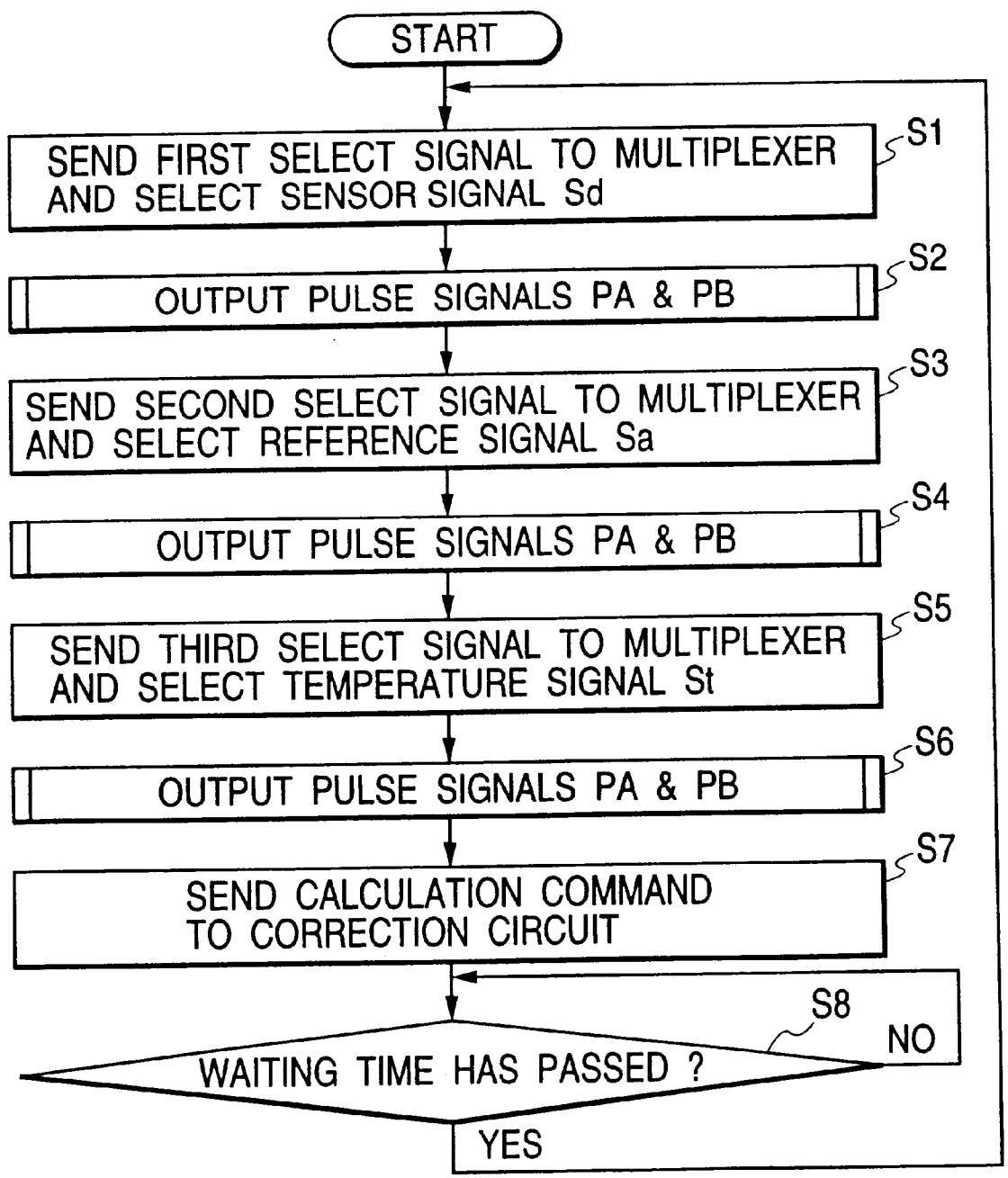
FIG. 8 is a flowchart showing the control performed by a control unit.

Hereinafter, a practical example of the present invention will be explained. FIGS. 6 through 8 cooperatively show a CMOS sensing circuit serving as a semiconductor pressure sensing apparatus in accordance with a preferred embodiment of the present invention.

As shown in an overall circuit arrangement shown in FIG. 6, the semiconductor pressure sensing apparatus comprises a sensing section 1 which detects the pressure and a signal processing section 2 which is made of a CMOSIC chip to process the output of the sensing portion 1. The sensing section 1 and the signal processing section 2 are formed separately on different semiconductor chips. However, it is possible to integrate the sensing section 1 and the signal processing section 2 on a same chip, if preferable result is obtained.

The sensing section 1 is made of a semiconductor chip (e.g., silicon monocrystal) having a large piezoelectric-resistance coefficient. The sensing section 1 comprises a pressure detecting bridge circuit 3 and a temperature detecting bridge circuit 4. The pressure detecting bridge circuit 3 detects a pressure applied to this circuit. The temperature detecting bridge circuit 4 detects the temperature of the pressure detecting bridge circuit 3.

More specifically, the pressure detecting bridge circuit 3 comprises a total of four diffused resistance elements Rd1, Rd2, Rd3 and Rd4 which are formed on a diaphragm of a semiconductor chip and arranged in a full bridge connection pattern. The resistance value of each of resistance elements Rd1, Rd2, Rd3 and Rd4 varies in response to an applied pressure. In FIG. 6, an up arrow indicates that the resistance value increases in response to an applied pressure. A down arrow indicates that the resistance value decreases in response to the applied pressure. An input terminal P1 of pressure detecting bridge circuit 3 receives a constant voltage applied from a constant-voltage power supply terminal +Vcc. Another input terminal P2 of pressure detecting bridge circuit 3 is grounded.

Accordingly, one output terminal Q1 (i.e., a joint point of resistance elements Rd1 and Rd2) of pressure detecting bridge circuit 3 has an electric potential increasing in proportion to the applied pressure. The other output terminal Q2 (i.e., a joint point of resistance elements Rd3 and Rd4) of pressure detecting bridge circuit 3 has an electric potential decreasing in proportion to the applied pressure. Thus, a sensor signal Sd having a voltage level corresponding to the applied pressure is detectable between two output terminals Q1 and Q2. The sensor signal Sd varies in response to the temperature of the pressure detecting bridge circuit 3. The temperature detecting bridge circuit 4 obtains the data required for removing such a temperature drift component.

The temperature detecting bridge circuit 4 comprises a total of four resistance elements Rt1, Rt2, Rc1 and Rc2 which are arranged in a full bridge connection pattern. Each of resistance elements Rt1 and Rt2 are made of a diffused resistor having a temperature coefficient of approximately 1,500 to 1,700 ppm/° C.). Each of resistance elements Rc1 and Rc2 are made of a non-sensitive material, such as CrSi, which has a temperature coefficient of approximately 0. An input terminal P3 of temperature detecting bridge circuit 4 receives the constant voltage applied from the constant-voltage power supply terminal +Vcc. Another input terminal P4 of temperature detecting bridge circuit 4 is grounded.

Accordingly, one output terminal Q3 (i.e., a joint point of resistance elements Rt1 and Rc1) of temperature detecting bridge circuit 4 has an electric potential increasing in proportion to a detected temperature. The other output terminal Q4 (i.e., a joint point of resistance elements Rt2 and Rc2) of temperature detecting bridge circuit 4 has an electric potential decreasing in proportion to the detected temperature. Thus, a temperature signal St having a voltage level corresponding to the temperature of the pressure detecting bridge circuit 3 is detectable between two output terminals Q3 and Q4.

The signal processing section 2 comprises the following circuit elements formed on a semiconductor chip.

A reference voltage generating circuit 5 comprises diffused resistance elements Ra1 and Ra2 serially connected between the constant-voltage power supply terminal +Vcc and the ground terminal. The resistance elements Ra1 and Ra2 have a same temperature coefficient. The reference voltage generating circuit 5 has an output terminal Q5 (i.e., ajoint point of resistance elements Ra1 and Ra2) which outputs a reference signal Sa having a constant voltage level irrespective of the pressure acting on the pressure detecting bridge circuit 3 and the temperature of the pressure detecting bridge circuit 3. It is possible to form the reference voltage generating circuit 5 on the semiconductor chip of the sensing section 1.

An analog multiplexer 6 selectively outputs the sensor signal Sd obtained from the pressure detecting bridge circuit 3, the temperature signal St obtained from the temperature detecting bridge circuit 4, and the reference signal Sa obtained from the reference voltage generating circuit 5 in response to a select signal supplied from a control unit 7.

A high input-impedance differential amplification circuit 8, serving as an input circuit, comprises two operational amplifiers 8a and 8b of MOSFET input type and three resistors 8c, 8d and 8e. The differential amplification circuit 8 amplifies the output signals successively outputted from the analog multiplexer 6, and sends the amplified signals to an A/D conversion circuit 9 which functions as a measuring means. The differential amplification circuit 8 is associated with independently provided circuit elements of a constant-voltage power supply 8f and a resistor 8g. The constant-voltage power supply 8f serves as a signal generating means for adding a previously described intentional offset value to the amplified output voltage of the differential amplification circuit 8.

The amplified sensing signal Sd and the amplified temperature signal St obtained from the differential amplification circuit 8 are referred to as sensing objective signals in the present invention. An amplified reference signal Sa obtained from the differential amplification circuit has a constant voltage level. When the amplified reference signal Sa is added with the above-described intentional offset value, the resultant signal is referred to as a true intentional offset value. As described previously, when the intentional offset value is equal to or larger than two times the sensing objective signal, it becomes possible to reduce the noises in the actual levels. For example, when the intentional offset value is 10 times the maximum value of the sensing objective signal, approximately 90% of the noise components can be removed. Meanwhile, the electric power for differential amplification circuit 8 is supplied from the constant-voltage power supply terminal +Vcc.

The A/D conversion circuit 9 comprises a ring-gate delay circuit 10, a circulation frequency counter 11, and a stack memory 12. The ring-gate delay circuit 10, which is basically similar to the A/D conversion circuit disclosed in the U.S. Pat. No. 5,396,247 corresponding to the European Patent No. 561, 331 B1, comprises a NAND gate circuit 10a and even inverters 10b connected in a ring pattern. The NAND gate circuit 10a and each inverter 10b (cooperatively serving as an inversion circuit) have an inverting operation time varying in accordance with the power supply voltage. The ring-gate delay circuit 10 is hereinafter referred to as RGD. The circulation frequency counter 11 counts a circulation frequency (i.e., a number of times of complete circulation) of a pulse signal in the RGD 10. The stack memory 12 stores the count value of the circulation frequency counter 11 as upper bits and stores the output of each inverter 10b as lower bits.

The A/D conversion circuit 9 operates in the following manner. FIG. 7 shows a pulse signal PA applied to the NAND gate 10a in the RGD 10. The NAND gate 10a and each inverter 10b start an inverting operation successively in accordance with the power supply voltage. The signal circulating operation is continuously performed during an ON duration of the pulse signal PA. Meanwhile, the stack memory 12 receives real-time binary data representing the circulation frequency of the pulse signal. Each build-up of a pulse signal PB shown in FIG. 7 latches the stack memory 12. The pulse signal PB is used to obtain a predetermined sampling period Δt (e.g., equal to or less than 100 μsec). Based on a difference between respective latch data in the stack memory 12, binary data is obtained as a value representing the power supply voltage supplied to the inverter 10b.

In this case, the power supply voltage is applied from the differential amplification circuit 8 to the NAND gate 10a and each inverter 10b in the RGD 10. Thus, the A/D conversion circuit 9 converts an output signal of the differential amplification circuit 8 into digital data. In other words, the sensor signal Sd, the temperature signal St and the reference signal Sa, selectively outputted from the analog multiplexer 6, is converted into digital data. The constant-voltage power supply 8f adds a same intentional offset value to each amplified voltage of the sensor signal Sd, the temperature signal St and the reference signal Sa.

The digital data produced from the A/D conversion circuit 9 are referred to in the following manner:

pressure information D represents the digital data corresponding to the sensor signal Sd;

temperature information T represents the digital data corresponding to the temperature signal St; and reference information A represents the digital data corresponding to the reference signal Sa.

The reference information A corresponds to a measured voltage level of a signal obtained by adding a constant intentional offset value to the amplified reference signal Sa having a predetermined voltage level. In other words, the reference information A corresponds to the measured intentional offset value "a" which is previously described. The pressure information D and the temperature information T correspond to measured voltage levels of signals obtained by adding the above-described intentional offset value to each of two kinds of sensing objective signals, i.e., the amplified sensor signal Sd and the amplified temperature signal St, respectively. In other words, the pressure information D and the temperature information T correspond to the measured signal value "b" which is previously described.

The pressure information D is defined by the following equation ① based on the voltage P applied to the pressure detecting bridge circuit 3.

$$D=\{(ct+d) \times P + kt + f\} \times \beta(t) \qquad ①$$

"t" represents a temperature of the pressure detecting bridge circuit 3, "c" represents a temperature coefficient in the sensitivity of the pressure detecting bridge circuit 3, "d" represents a room temperature sensitivity of the pressure detecting bridge circuit 3, "k" represents a temperature coefficient of an offset of a detected pressure value, and "f" represents a room temperature offset value of the detected pressure value.

Furthermore, β(t) is a nonlinear term which is dependent on the temperature characteristics of the differential amplification circuit 8 and the temperature characteristics of the delay time of the RGD 10. In other words, β(t) is a factor causing deterioration in the accuracy of pressure detection.

To solve "P" from the equation ①, it is necessary to obtain "t" and remove β(t). To this end, the temperature information T is obtained from the temperature detecting bridge circuit 4 and the reference information A is obtained from the reference voltage generating circuit 5.

The following equation ② represents the relationship between the temperature information T and the temperature "t" of the pressure detecting bridge circuit 3.

$$T=(rt+q) \times \beta(t) \qquad ②$$

where "r" represents a temperature coefficient of a detected temperature value, and "q" represents a room temperature offset value of the detected temperature value.

To obtain the reference information A, the differential amplification circuit 8 amplifies the reference signal Sa and the A/D conversion circuit 9 converts the amplified signal into digital data. The reference signal Sa has a constant voltage level irrespective of the pressure acting on the pressure detecting bridge circuit 3 and the temperature of the pressure detecting bridge circuit 3. Accordingly, the following relationship ③ is expressed.

$$A=\beta(t) \qquad ③$$

By solving "P" from the above equations ② and ③, the nonlinear term β(t) can be deleted as shown in the following equation ④.

$$P=\{(T/A-q) \times (-k/r) + D/A - f\} / \{(T/A-q) \times c/r + d\} \qquad ④$$

An EPROM 13 stores the coefficient values of "r", "q", "c", "d", "k" and "f" which are required for calculating the pressure "P" defined by the equation ④.

As described above, A corresponds to the measured intentional offset value "a" and D and T correspond to measured signal value "b". The equation ④ includes the ratios of these data, i.e., T/A and D/A. In each ratio, the intentional offset value is included in the numerator and the denominator. Accordingly, as apparent from the previously-described principle, it becomes possible to reduce the low frequency noise components including D.C. noise components. In practical circuits, the low-frequency noise has a voltage level of several to several tens $\mu V$. Meanwhile, the resolution of the A/D conversion circuit is in a level of several to $10\,\mu V$. Both of them remain in the order of $\mu V$. The low-frequency noise includes the noise component of $(1/f)^n$ when the frequency is not larger than 10 Hz, where $n \geq 1$.

A correction circuit 14, serving as a data calculating circuit, performs the calculation for obtaining the pressure P defined by the equation ④ in response to a command sent from the control unit 7, with reference to the pressure information D, temperature information T and reference information A read from the stack memory 12 in addition to the coefficient values (r, q, c, d, k, f) read from the EPROM 13. The calculation result in the correction circuit 14 is outputted through an I/O block 15 as pressure data representing the detected pressure of the sensing section 1.

FIG. 8 is a flowchart showing a control procedure performed in the control unit 7 in accordance with the first embodiment.

First, in step S1, the control unit 7 sends a first select signal to the analog multiplexer 6. In response to the first select signal, the multiplexer 6 selects the sensor signal Sd supplied from the pressure detecting bridge circuit 3. The differential amplification circuit 8 amplifies the sensor signal Sd and produces a voltage signal corresponding to the amplified sensor signal Sd. This voltage signal includes the intentional offset value and serves as a first signal to be processed in the A/D conversion circuit 9. Namely, the first signal is applied to the RGD 10 in the A/D conversion circuit 9.

Thereafter, in step S2, the control unit 7 executes a control routine for outputting the pulse signals PA and PB to the A/D conversion circuit 9. More specifically, in the step S2, the control unit 7 generates the pulse signal PA during a time period from t1 to t2 as shown in FIG. 7. Meanwhile, after the time t1, the control unit 7 generates the pulse signal PB which rises four times by the time t2 as shown in FIG. 7.

With such generation of pulse signals PA and PB, the first signal circulates in the RGD 10 continuously during an on-time of the pulse signal PA. Each build-up of the pulse signal PB latches the stack memory 12. The control unit 7 obtains a difference between latch data, e.g., a difference between the latch data at the third build-up timing and the latch data at the fourth build-up timing. Then, the control unit 7 obtains the digital data representing the pressure information D which is dependent on the first signal (i.e., amplified sensor signal Sd) supplied from the differential amplification circuit 8.

Then, in step S3, the control unit 7 sends a second select signal to the analog multiplexer 6. In response to the second select signal, the multiplexer 6 selects the reference signal Sa supplied from the reference voltage generating circuit 5.The differential amplification circuit 8 amplifies the reference signal Sa and produces a voltage signal corresponding to the amplified reference signal Sa. This voltage signal includes the intentional offset value and serves as a second signal to be processed in the A/D conversion circuit 9. Namely, the second signal is applied to the RGD 10 in the A/D conversion circuit 9.

Thereafter, in step S4, the control unit 7 executes the control routine for outputting the pulse signals PA and PB. More specifically, in the step S4, the control unit 7 generates the pulse signal PA during a time period from t3 to t4 as shown in FIG. 7. Meanwhile, after the time t3, the control unit 7 generates the pulse signal PB which rises several times by the time t4 as shown in FIG. 7.

With such generation of pulse signals PA and PB, the second signal circulates in the RGD 10 continuously during an on-time of the pulse signal PA. Each build-up of the pulse signal PB latches the stack memory 12. The control unit 7 obtains a difference between latch data. Then, the control unit 7 obtains the digital data representing the reference information A which is dependent on the second signal (i.e., amplified reference signal Sa) supplied from the differential amplification circuit 8.

Then, in step S5, the control unit 7 sends a third select signal to the analog multiplexer 6. In response to the third select signal, the multiplexer 6 selects the temperature signal St supplied from the temperature detecting bridge circuit 4. The differential amplification circuit 8 amplifies the temperature signal St and produces a voltage signal corresponding to the amplified temperature signal St. This voltage signal includes the intentional offset value and serves as a third signal to be processed in the A/D conversion circuit 9. Namely, the third signal is applied to the RGD 10 in the A/D conversion circuit 9.

Thereafter, in step S6, the control unit 7 executes the control routine for outputting the pulse signals PA and PB. More specifically, in the step S6, the control unit 7 generates the pulse signal PA during a time period from t5 to t6 as shown in FIG. 7. Meanwhile, after the time t5, the control unit 7 generates the pulse signal PB which rises several times by the time t6 as shown in FIG. 7.

With such generation of pulse signals PA and PB, the third signal circulates in the RGD 10 continuously during an on-time of the pulse signal PA. Each build-up of the pulse signal PB latches the stack memory 12. The control unit 7 obtains a difference between latch data. Then, the control unit 7 obtains the digital data representing the temperature information T which is dependent on the third signal (i.e., amplified temperature signal St) supplied from the differential amplification circuit 8.

Then, in step S7, the control unit 7 generates a calculation command to the correction circuit 14. In response to this calculation command, the correction circuit 14 performs the calculation for obtaining the pressure P defined by the equation ④, with reference to the pressure information D, the temperature information T and the reference information A read from the stack memory 12 in addition to the coefficient values (r, q, c, d, k, f) read from the EPROM 13. The calculation result in the correction circuit 14 is outputted through the I/O block 15 as pressure data representing the detected pressure of the sensing section 1.

Then, in step S8, the control unit 7 checks whether a predetermined time (i.e., a waiting time) has passed or not. When the judgement result is NO in the step S8, the control unit 7 repeats the judgement of step S8 until the waiting time has passed. When the judgement result is YES in the step S8, the control flow returns to the step S1. Thus, the processing procedure of steps S1 to S7 is cyclically performed at predetermined time intervals.

In short, the above-described first embodiment uses the analog multiplexer 6 which performs the time-divisional processing for successively detecting the sensor signal Sd, the temperature signal St, and the reference signal Sa. The differential amplification circuit 8 is commonly used for amplifying each voltage level of the sensor signal Sd, the temperature signal St, and the reference signal Sa. The intentional offset value of a constant level is added to the amplified voltage signal. The A/D conversion circuit 9 measures the voltage level of the summed-up voltage signal to obtain the digital data (pressure information D, temperature information T and reference information A) corresponding to the detected signals Sd, St and Sa.

Figure 9:
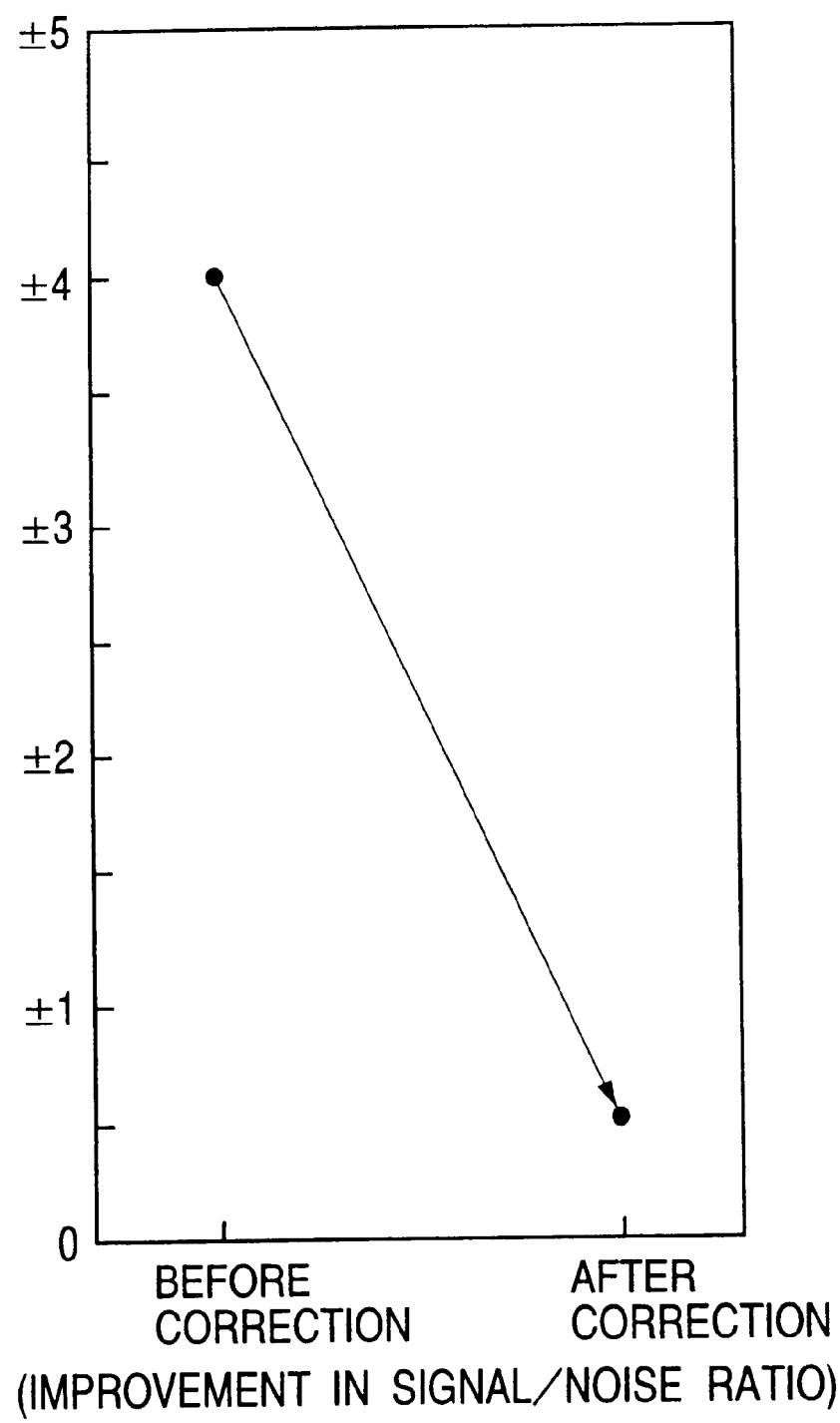
FIG. 9 is a graph showing the measuring result of improved S/N ratio.

In this case, the reference information A corresponding to the measured intentional offset value "a" (or a')" shown in the equation (1). The pressure information D and the temperature information T correspond to the measured signal value "b (or b')" shown in the equation (1). Accordingly, when the intentional offset value is larger than two times (preferably 10 times) the sensing objective signal (i.e., the amplified sensor signal Sd and the amplified temperature signal St), it becomes possible to reduce the noise components. The S/N ratio of the detected output can be improved. FIG. 9 shows the actually measured result showing an improved S/N ratio obtained by employing the above-described arrangement.

All of the sensor signal Sd, the temperature signal St and the reference signal Sa, which are finally converted into the pressure information D, the temperature information T and the reference information A used in the equation ④, are processed in the common analog circuit including the analog multiplexer 6 and the differential amplification circuit 8 and the A/D conversion circuit 9. This is effective to cancel any drift components of respective signals caused due to variation or fluctuation of circuit constants in the signal transmission path. The circuit will not be subjected to the aging problem in the ratio values of T/A and D/A defined in the equation ④. As a result, it becomes possible to eliminate any influence of the deterioration in the durability. For example, the stress acting on the protecting film covering the semiconductor chip will decrease due to the aging. The offset values of operational amplifiers 8a and 8b in the differential amplification circuit 8 may deviate from the initial values due to the influence of such aging phenomenon. Similarly, the pair ratio of the sensor resistors may differ from the initial value. Accordingly, the above-described arrangement makes it possible to assure the long-lasting sensing accuracy in the detection of the pressure.

To realize improved accuracy in the pressure detection, the differential amplification circuit 8 is generally required to be large in scale so as to have higher amplification ability. The above-described embodiment commonly uses the differential amplification circuit 8 for processing all of the sensor signal Sd, the temperature signal St and the reference signal Sa. There is no necessity of providing numerous differential amplification circuits. The overall size of the circuit can be downsized.

The above-described embodiment uses the A/D conversion circuit 9 including the RGD 10. The conversion speed is greatly increased, and therefore the sampling time can be greatly reduced. As a result, the sensed pressure value can be promptly calculated within a short time.

Furthermore, according to the above-described embodiment, two sensing objective signals are detected. The pressure information D and the temperature information T are the measured signal values corresponding to these sensing objective signal. The reference information A is the measured intentional offset value. The measuring operation for obtaining the reference information A is sandwiched between the measuring operations for obtaining the pressure information D and the temperature information T. Namely, the measurement is performed in order of D→A→T.

According to this measuring order, it becomes possible to minimize an average of time intervals between the measuring operation for obtaining the reference information A and the measuring operations for obtaining the pressure information D and the temperature information T. In other words, it becomes possible to quickly accomplish the calculation for each of T/A and D/A which is required to obtaining the pressure P based on the equation ④. As a result, the low-frequency noise involved in each of the measured values (D, A, T) can be equalized with each other. Thus, it is believed that each of T/A and D/A defined in the equation ④ receives substantially the same influence from the low-frequency noise. The low-frequency noise component (including the DC noise component) can be effectively removed from the calculation result. The sensing accuracy of the pressure P can be improved.

Needless to say, when the measurement is performed in order of T→A→D, the sensing accuracy of the pressure P can be improved equally. However, it may be difficult to sandwich the measuring operation for obtaining the measured intentional offset value (referred to ΔA) between the measuring operations for obtaining the measured signal values (referred to ΔD and ΔT). In such a case, the measuring order is determined in the following manner.

Considering the sensing accuracy, the measuring order is determined so as to minimize a time interval between the measuring operation for obtaining the measured intentional offset value ΔA and the measuring operation for obtaining a measured signal value (one of ΔD and ΔT) corresponding to a specific sensing objective signal giving the largest influence to the sensing accuracy. For example, when ΔD is important, a preferable measuring order will be ΔA→ΔD→ΔT or ΔT→ΔD→ΔA. This is advantageous in that the low-frequency noise component involved in the measured signal value ΔD can be substantially equalized with the low-frequency noise component involved in the measured intentional offset value ΔA. Thus, it becomes possible to enhance the noise removing effect for the specific sensing objective signal giving the largest influence to the sensing accuracy. As a whole, the sensing accuracy of the sensing circuit can be improved.

According to the above-described embodiment, the control routine shown in FIG. 8 includes a total of three steps (S2, S4, and S6) for outputting the pulse signals PA and PB. In each of these steps (S2, S4, and S6), the digital data are obtained from the stack memory 12 based on the difference between latch data. Thus, it is possible to arrange the system to obtain averaged digital data (pressure information D, reference information A, and temperature information T). In this case, it becomes possible to reduce both the low-frequency noise component and the high-frequency noise component. Hereinafter, the principle for reducing the high-frequency noise component will be explained with reference to FIGS. 10 and 11.

Figure 10:
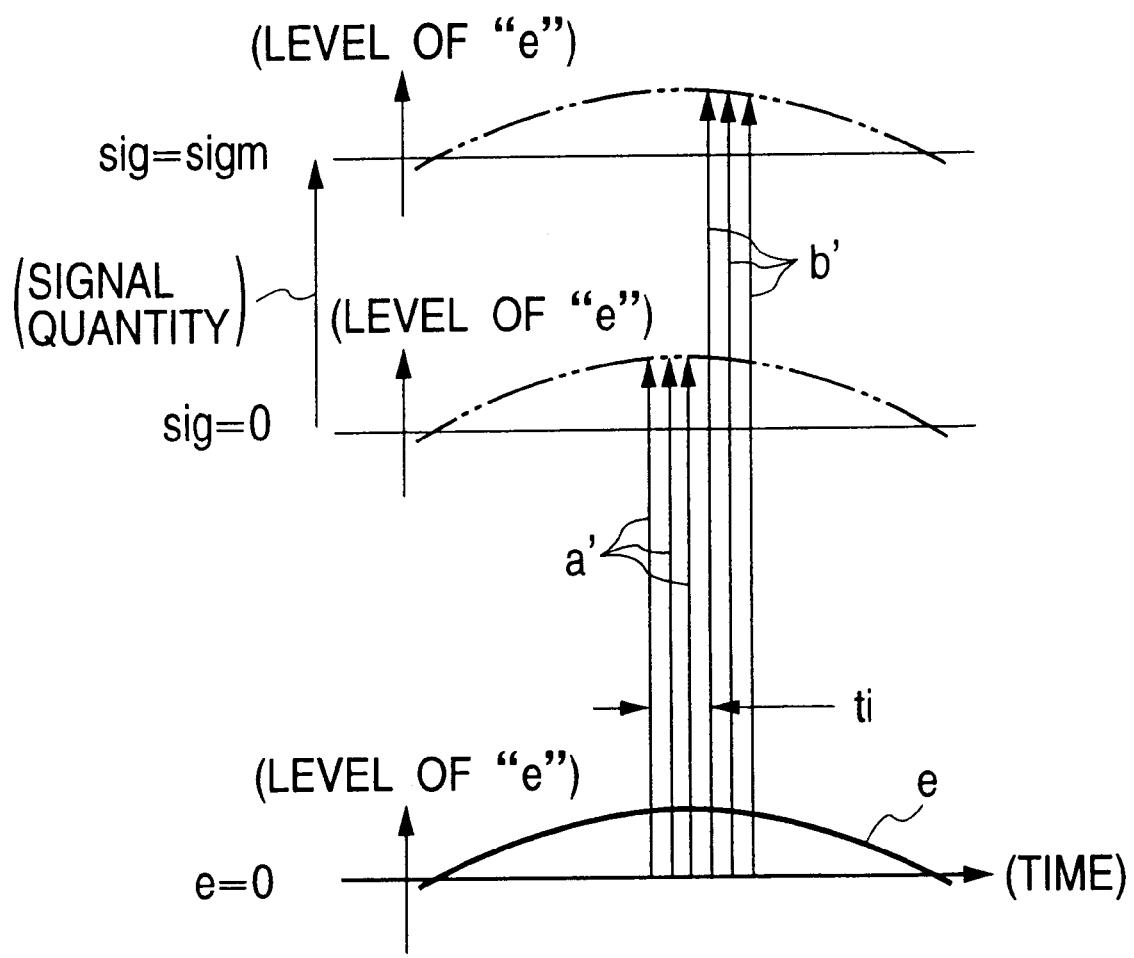
FIG. 10 is a signal waveform view illustrating the principle of high-frequency noise reduction (Part I)

According to the example shown in FIG. 10, the measuring operation for obtaining the measured intensional offset value a' involving the noise component "e" is performed repetitively (i.e., three consecutive measuring operations for a'). Thereafter, the measuring operation for obtaining the measured signal value b' involving the noise component "e" is performed repetitively (i.e., three consecutive measuring operations for b'). The measuring order between the measured values a' and b' can be reversed. In this case, a time interval "ti" between the measuring operations for corresponding measured values a' and b' is relatively large. However, as the low-frequency noise level varies slowly, it is believed that the low-frequency noise components involved in the measuring data for the same measuring object are substantially identical with each other. Accordingly, by employing the above-described noise reducing method, the low-frequency noise can be effectively removed.

Meanwhile, an average value of the measured intentional offset value a' and an average value of the measured signal value b' are obtained based on a plurality of sampling data thus obtained through the consecutive measuring operations. The representative (i.e., averaged) measured values are used for removing the noise. This is advantageous in that the high-frequency noise components can be removed together with the low-frequency noise components due to integration effect obtained by averaging the plurality of sampling data of the measured values. The effect of reducing the high-frequency noise components can be enhanced by increasing the total number of sampling data, i.e., by increasing the repetition number of the measuring operations for the same sensing object. As described above, it is preferable that the repetitive measuring operations for obtaining the measured signal value and the repetitive measuring operations for obtaining the measured signal value are successively performed in this order or in the opposite order. This is advantageous in that the switching operation between two measuring objects is done only one time. In the case of obtaining the pressure information D, the reference information A, and the temperature information T, only two switching operations are required. The switching operation is simple.

Figure 11:
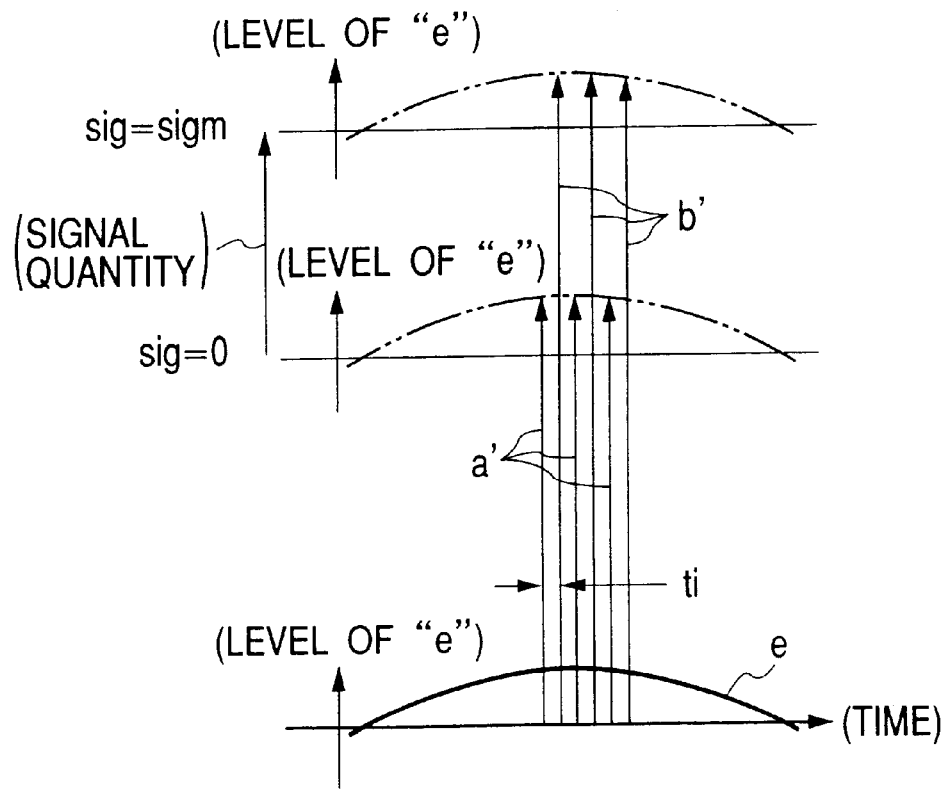
FIG. 11 is a signal waveform view illustrating the principle of high-frequency noise reduction. (Part II)

According to the example shown in FIG. 11, the measuring operation for obtaining the measured intensional offset value a' involving the noise component "e" and the measuring operation for obtaining the measured signal value b' involving the noise component "e" are successively performed in this order or in the opposite order as a cycle to be repetitively performed (i.e., three consecutive measuring operation cycles). An average value of the measured intentional offset value a' and an average value of the measured signal value b' are obtained based on a plurality of sampling data thus obtained through the consecutive measuring cycles. The representative (i.e., averaged) measured values are used for removing the noise. This is advantageous in that the high-frequency noise components can be removed together with the low-frequency noise components due to integration effect obtained by averaging the plurality of sampling data of the measured values. Especially, according to this example, the measuring operation for obtaining the measured intentional offset value a' and the measuring operation for obtaining the measured signal value b' are performed as a set. This is advantageous in that the time interval between the measuring operations for the values a' and b' can be reduced. As a result, it becomes possible to substantially equalize the low-frequency noise involved in the measured value a' with the low-frequency noise involved in the measured value b'. Accordingly, by employing the above-described noise reducing method, the low-frequency noise can be removed satisfactorily.

The present invention is not limited to the above-described embodiment, and therefore can be modified in the following manner.

In the above-described embodiment, the signal quantity of the sensing objective signal is a voltage level. Thus, the intentional offset value is set as a voltage value. However, the signal quantity will be different when the sensing objective signal has different characteristics. For example, the present invention is applicable to a sensing circuit in which the signal quantity of the sensing objective signal is represented by time information (pulse period or frequency). In such a case, the intentional offset value will be set as a time value larger than this time information. As an example of this kind of sensing circuit, there is an arrangement comprising a transducer whose capacitance varies in accordance with the sensing object physical quantity. The capacitance change of the transducer is detectable as a variation in the CR time constant of a CR oscillator, i.e., as a variation in the oscillation frequency. The intentional offset value (time value) can be obtained by using a clock signal of a constant period. The intentional offset time can be converted into a numerical value by using a pulse phase difference encoding circuit, which is for example disclosed in the U.S. Pat. No. 5,128,624 corresponding to the European Patent No. 439, 178 B1. By performing the digital processing of the numerical data in the same manner as in the above-described embodiment, the noise can be reduced.

Figure 12:
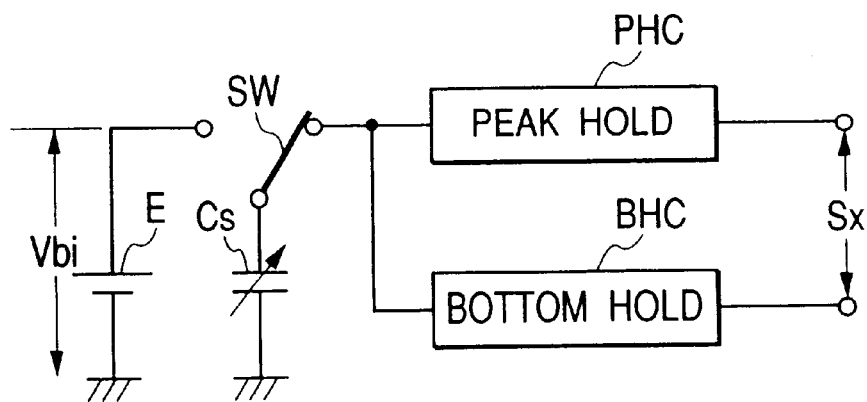
FIG. 12 is a block diagram schematically showing other embodiment of the present invention.

Furthermore, the noise removing method of the present invention can be applied to a sensing circuit which performs the measuring operation in accordance with a voltage signal converted from the capacitance change representing the sensing objective physical quantity. The sensing accuracy can be improved. FIG. 12 shows an example of a capacitance-type semiconductor sensor for detecting a dynamical quantity (for example disclosed in the unexamined Japanese patent publication No. 9-211022). In FIG. 12, a capacitor Cs has a capacitance variable in accordance with the angular velocity. An initial bias voltage Vbi is applicable to the capacitor Cs from a power supply E via a changeover switch SW to hold a constant charge amount in this capacitor Cs. After the changeover switch SW is once connected to the power supply E, the change switch SW is switched to a peak hold circuit PHC and to a bottom hold circuit BHC each having a high input impedance. In this condition, when the capacitance of the capacitor Cs varies from a minimum value to a maximum value in accordance with an angular velocity, a voltage signal Sx is obtained between the peak hold circuit PHC and the bottom hold circuit BHC. Thus, by replacing the sensor signal Sd shown in FIG. 6 with the voltage signal Sx, it becomes possible to modify the sensing circuit shown in FIG. 6 into an angular velocity sensor (i.e., yaw rate sensor). Needless to say, when the capacitance of the capacitor Cs varies in accordance with a pressure or an accelerator, the sensing circuit shown in FIG. 6 can be used as a pressure sensor or an accelerator sensor.

Besides pressure, accelerator and angular velocity, the present invention is applicable to a sensing circuit for detecting other physical quantity, such as torque, speed, magnetic flux, humidity, flow rate and concentration. Furthermore, the piezoelectric-resistance elements, used in the pressure detecting bridge circuit 3 shown in FIG. 6 so as to serve as a sensing objective signal generating source, can be replaced by other elements, such as hall devices or MREs (magneto-resistive elements). Moreover, the detailed circuit arrangement of RGD 10 in the A/D conversion circuit 9 can be flexibly modified.

In general, the MOS transistors are bothered by low-frequency noises. Similarly, the bipolar transistors and the compound transistors (HBT, HEMT etc) are subjected to low-frequency noises, although the degree of adverse influence given from the low-frequency noises is different. Hence, the noise removing or correction processing of the present invention is effectively applicable to almost all of the transistors and to various circuits.

In the above-described embodiment, the circuit for generating the intentional offset value is positioned as a pre-stage analog circuit corrected to the A/D conversion circuit.

It is however possible to directly give an intentional offset value as digital data to an output of the A/D conversion circuit.

Figure 13:
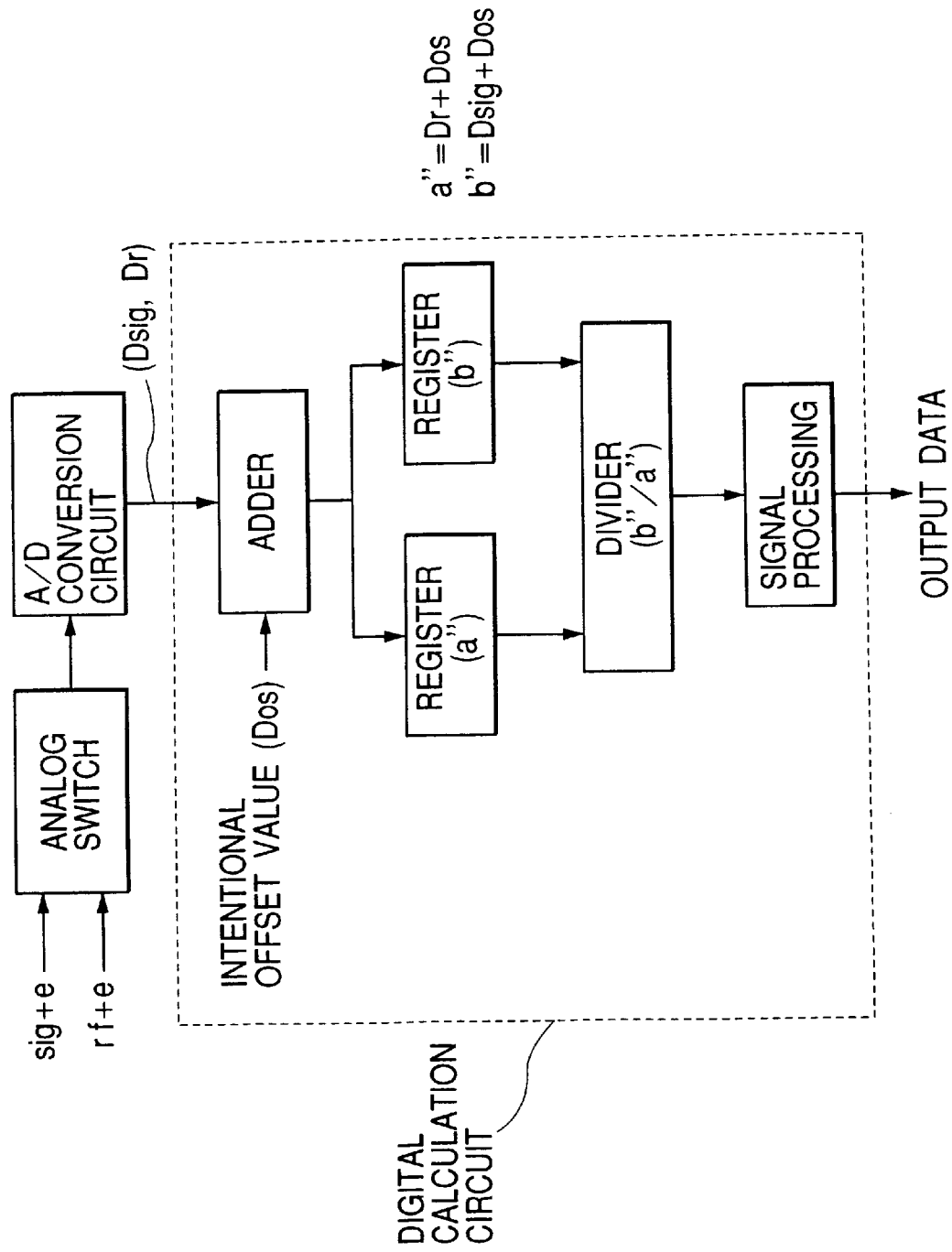
FIG. 13 is a block diagram showing a schematic arrangement of another signal processing circuit which is used to removing the noise.

FIG. 13 is a block diagram showing a schematic arrangement of another signal processing circuit which is used to removing the noise. An analog switch performs a predetermined switching operation for selectively inputting an input signal having a voltage value corresponding to a summation of the sensing objective signal "sig" and the noise component "e" and an input signal having a voltage value corresponding to a summation of a referential objective value "rf" and the noise component "e." The selected signal is converted into digital data Dsig or Dr by an A/D conversion circuit. The A/D conversion data (i.e., digital data Dsig and Dr) are sent to an adder.

The intentional offset value is set as digital data Dos. The adder adds the intentional offset data Dos to the digital data Dsig to produce a measured signal value b" (b"=Dsig+Dos). Similarly, the adder adds the intentional offset data Dos to the digital data Dr to produce a measured intentional offset value a" (a"=Dr+Dos). The signal processing performed after adding the intentional offset data Dos is identical with that disclosed in the above-described embodiment. Namely, the measured intentional offset value a" and the measured signal value b" are stored in respective registers. A divider obtains the correction data (=b"/a").

According to this method, it becomes possible to equalize the dynamic range of the A/D conversion circuit with respective variation ranges of the sensing objective signal "sig" and the referential objective value "rf." The requirement to the performance of the A/D conversion circuit can be moderated.

The A/D converted value Dsig of the sensing objective signal "sig" and the A/D converted value Dr of the referential objective value "rf" are defined in the following equations.

$$Dsig = Dtrsig + De$$

$$Dr = Dtrr + De$$

where Dtrsig represents the A/D conversion data corresponding to a true sensing objective signal, Dtrr represents the A/D conversion data corresponding to a true referential objective value, and De represents the A/D conversion data corresponding to the noise "e."

The referential objective value can be set by using the reference voltage generating circuit 5 shown in FIG. 6. In this case, the setting of the referential objective value "rf" can be easily done by adequately setting the resistance elements Ra1 and Ra2.

For example, it is now assumed that the constant-voltage power supply 8f produces no output. In other words, the constant-voltage power supply 8f does not function as the signal generating means for generating the intentional offset value. Instead, this embodiment adds the intentional offset data Dos to the A/D converted data.

First, it is possible to set the referential objective value "rf" so as to correspond to the sensing objective signal sig=0. In general, when the sensing objective signal "sig" is 0, the sensor output Sd of the sensing full bridge circuit 3 becomes 0. Accordingly, by grounding the output voltage Sa of the reference signal generating circuit 5 (i.e., Sa=0V), the input voltage to the A/D conversion circuit can be equalize to 0 (Sa=0V=Sd). To this end, it is preferable to set the resistance values of the resistance elements Ra1 and Ra2 to appropriate values (e.g., Ra1=100 kΩ and Ra2=0Ω).

Second, it is possible to set the referential objective value "rf" so as to correspond to 50% of the maximum value of the sensing objective value "sig." In such a case, the referential objective value "rf" is equalized to ½ of the power supply voltage Vcc of the bridge circuit. To realize this, the resistance values of the resistance elements Ra1 and Ra2 are equalized (e.g., Ra1=Ra2=100 kΩ). In this manner, the referential objective value "rf" can be arbitrarily set by adjusting the resistance values of the resistance elements Ra1 and Ra2.

The noise removing method of the present invention can be theoretically applicable to both of the analog signal processing and the digital signal processing. Especially, the present invention is effectively employed in the digital processing since the digital circuit is robust against the thermal noise or the electromagnetic noise.

The digital circuit can be manufactured by using a standard CMOS element which is advantageous in cost and is capable of maintaining information with a higher S/N ratio in the signal processing.

Figures 14A, 14B:
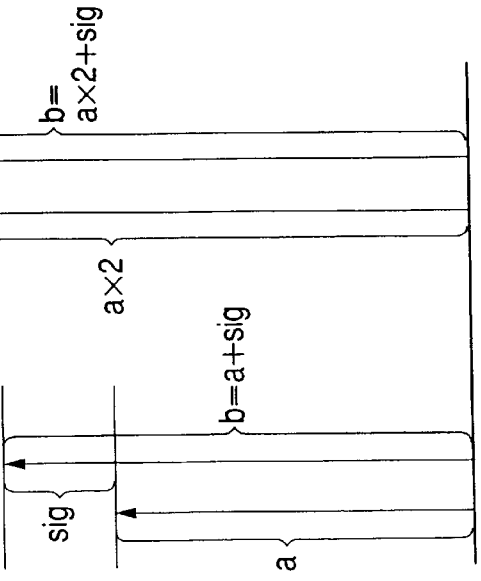
FIGS. 14A and 14B are views cooperatively showing the effects of the noise removing method in accordance with the preferred embodiment of the present invention.

When the intentional offset value "a" is doubled (i.e., a×2) as shown in FIG. 14A, the variation of the correction result S responsive to the variation of the sensing objective signal "sig" is reduced to a half value. This may be regarded as deterioration in the sensitivity. However, according to the digital processing, its information amount is substantially dependent on a significant digit number with respect to the signal. In other words, it is possible to prevent the deterioration in the sensitivity by securing the required digit number (i.e., bit number).

As shown in FIG. 14B, in the conditions of sig=100, e=100 and a=1,000, the significant digit number of the signal "sig" is 3. Thus, the significant figures in the correction result S is 3 digits of first to third decimal places. When the intentional offset value "a" is increased to 10 times the above case (i.e., a=10,000), the significant digit number of the signal "sig" remains same (i.e., 3). Accordingly, the significant figures in the correction result S becomes 4 digits of first to fourth decimal places. In this case, the noise reducing effect is increased to 10 times the above case (while the error rate ∈r is reduced to a 1/10 level). When the intentional offset value is further increased, the noise reducing effect will increase correspondingly although the degree of obtainable effect is substantially restricted by the significant digit number of the signal "sig."

In view of the above, it is preferable to increase the significant digit number (i.e., the bit number in the A/D conversion) of the signal "sig" to enhance the low-frequency noise removing effect and to improve the accuracy. For example, even when the intentional offset value "a" is identical (e.g., a=100,000 as indicated by ⊙ in FIG. 14B), the accuracy of the different correction result S varies in accordance with the significant digit number of the signal "sig." Hence, it is preferable to set an optimum digit number so as to eliminate useless processing. Needless to say, the correction result S corresponding to the significant digit number is used as the sensor output (i.e., sensor output signal).

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A low-frequency noise removing method for removing a low-frequency noise having a noise component proportional to 1/f and $(1/f)^n$, where "f" represents a noise frequency and $n \geq 1$, which is applicable to a sensing circuit with an A/D conversion means for converting the signal quantity of a sensing objective signal, said method comprising the steps of:

setting an intentional offset value beforehand, said intentional offset value being larger than said sensing objective signal;

converting said intentional offset value into digital data by said A/D conversion means to obtain intentional offset data representing the quantity of said intentional offset value;

converting a sum of said sensing objective signal and said intentional offset value into digital data by said A/D conversion means to obtain sensed signal data representing a summation of the quantity of said sensing objective signal and the quantity of said intentional offset value;

obtaining a ratio of said sensed signal data to said intentional offset data; and using said ratio as noise reducing signal data for reducing the low-frequency noise involved in a sensor output.

2. The low-frequency noise removing method in accordance with claim 1, wherein information corresponding to a significant digit number of said ratio is used as said noise reducing data.

3. A noise removing method applicable to a sensing circuit with a measuring means for measuring the signal quantity of a sensing objective signal, said method comprising the steps of:

setting an intentional offset value beforehand, said intentional offset value being larger than said sensing objective signal;

measuring said intentional offset value by said measuring means to obtain a measured intentional offset value representing the quantity of said intentional offset value;

measuring a sum of said sensing objective signal and said intentional offset value by said measuring means to obtain a measured signal value representing a summation of the quantity of said sensing objective signal and the quantity of said intentional offset value;

obtaining a ratio of said measured signal value to said measured intentional offset value; and using said ratio as noise reducing data for reducing the noise involved in a sensor output.

4. The noise removing method for a sensing circuit in accordance with claim 3, wherein a measuring operation for obtaining said measured intentional offset value by said measuring means and a measuring operation for obtaining said measured signal value by said measuring means are performed at a time interval which is sufficiently shorter than the period of the noise to be removed.

5. The noise removing method for a sensing circuit in accordance with claim 4, wherein the measuring operation for obtaining said measured intentional offset value by said measuring means and the measuring operation for obtaining said measured signal value by said measuring means are performed at a time interval equal to or smaller than $\frac{1}{10}$ of the period of the noise to be removed.

6. The noise removing method for a sensing circuit in accordance with claim 3, wherein the measuring operation for obtaining said measured intentional offset value by said measuring means is performed repetitively to obtain a plurality of samples of said measured intentional offset value, the measuring operation for obtaining said measured signal value by said measuring means is performed repetitively to obtain a plurality of samples of said measured signal value, calculating an average of said plurality of samples of said measured intentional offset value and an average of said plurality of samples of said measured signal value, obtaining an average ratio of the averaged value of said measured signal value to the averaged value of said measured intentional offset value, and using said average ratio as noise reducing data for reducing the noise involved in the sensor output.

7. The noise removing method for a sensing circuit in accordance with claim 6, wherein the repetitive measuring operations for obtaining said measured intentional offset value by said measuring means and the repetitive measuring operations for obtaining said measured signal value by said measuring means are successively performed in this order or in the opposite order.

8. The noise removing method for a sensing circuit in accordance with claim 3, wherein a measuring operation for obtaining said measured intentional offset value by said measuring means and a measuring operation for obtaining said measured signal value by said measuring means are successively performed.

9. The noise removing method for a sensing circuit in accordance with claim 3, wherein the measuring operation for obtaining said measured intentional offset value by said measuring means and the measuring operation for obtaining said measured signal value by said measuring means are successively performed in this order or in the opposite order as a cycle to be repetitively performed, calculating an average of a plurality of samples of said measured intentional offset value and an average of a plurality of samples of said measured signal value, obtaining an average ratio of the averaged value of said measured signal value to the averaged value of said measured intentional offset value, and using said average ratio as noise reducing data for reducing the noise involved in the sensor output.

10. The noise removing method for a sensing circuit in accordance with claim 3, wherein said intentional offset value is larger than two times the signal quantity of said sensing objective signal.

11. The noise removing method for a sensing circuit in accordance with claim 3, wherein said intentional offset value is equal to or larger than ten times a maximum value of the signal quantity of said sensing objective signal.

12. The noise removing method for a sensing circuit in accordance with claim 3, wherein said intentional offset value is equal to or larger than the quantity of the noise to be removed.

13. The noise removing method for a sensing circuit in accordance with claim 3, wherein said intentional offset value is produced from a signal producing means provided independent of an input circuit for said sensing objective signal.

14. The noise removing method for a sensing circuit in accordance with claim 3, wherein said measuring means is for measuring signal quantities of a plurality of sensing objective signals, and the measuring operation for obtaining said measured intentional offset value and the measuring operations for obtaining measured signal values corresponding to said plurality of sensing objective signals are performed in predetermined order so as to minimize an average of time intervals between said measuring operation for obtaining said measured intentional offset value and the measuring operations for obtaining respective measured signal values.

15. The noise removing method for a sensing circuit in accordance with claim 3, wherein said measuring means is for measuring signal quantities of a plurality of sensing objective signals, and the measuring operation for obtaining said measured intentional offset value and the measuring operations for obtaining measured signal values corresponding to said plurality of sensing objective signals are performed in predetermined order so as to minimize a time interval between said measuring operation for obtaining said measured intentional offset value and the measuring operation for obtaining a measured signal value corresponding to a specific sensing objective signal giving the largest influence to the sensing accuracy.

16. A CMOS sensing circuit comprising a CMOS element, comprising:

measuring means for measuring the signal quantity of a sensing objective signal; and signal generating means for generating an intentional offset value which is larger than said sensing objective signal;

wherein said measuring means is for measuring said intentional offset value to obtain a measured intentional offset value representing the quantity of said intentional offset value;

said measuring means is for measuring a sum of said sensing objective signal and said intentional offset value to obtain a measured signal value representing a summation of the quantity of said sensing objective signal and the quantity of said intentional offset value; and a data calculating circuit is provided for obtaining a ratio of said measured signal value to said measured intentional offset value, and for using said ratio as noise reducing data for reducing the noise involved in a sensor output.

17. The CMOS sensing circuit in accordance with claim 16, wherein said measuring means is for performing a measuring operation for obtaining said measured intentional offset value and a measuring operation for obtaining said measured signal value at a time interval which is sufficiently shorter than the period of the noise to be removed.

18. The CMOS sensing circuit in accordance with claim 17, wherein said measuring means is for performing the measuring operation for obtaining said measured intentional offset value and the measuring operation for obtaining said measured signal value at a time interval equal to or smaller than 1/10 of the period of the noise to be removed.

19. The CMOS sensing circuit in accordance with claim 16, wherein said measuring means is for repetitively performing the measuring operation for obtaining said measured intentional offset value to obtain a plurality of samples of said measured intentional offset value, and for repetitively performing the measuring operation for obtaining said measured signal value to obtain a plurality of samples of said measured signal value, and said data calculating circuit is for calculating an average of said plurality of samples of said measured intentional offset value and an average of said plurality of samples of said measured signal value, for obtaining an average ratio of the averaged value of said measured signal value to the averaged value of said measured intentional offset value, and for using said average ratio as noise reducing data for reducing the noise involved in the sensor output.

20. The CMOS sensing circuit in accordance with claim 19, wherein said measuring means is for successively performing the repetitive measuring operations for obtaining said measured intentional offset value and the repetitive measuring operations for obtaining said measured signal value in this order or in the opposite order.

21. The CMOS sensing circuit in accordance with claim 16, wherein said measuring means is for successively performing a measuring operation for obtaining said measured intentional offset value and a measuring operation for obtaining said measured signal value.

22. The CMOS sensing circuit in accordance with claim 16, wherein said measuring means is for successively performing the measuring operation for obtaining said measured intentional offset value and the measuring operation for obtaining said measured signal value in this order or in the opposite order as a cycle to be repetitively performed, and said data calculating circuit is for calculating an average of a plurality of samples of said measured intentional offset value and an average of a plurality of samples of said measured signal value, for obtaining an average ratio of the averaged value of said measured signal value to the averaged value of said measured intentional offset value, and for using said average ratio as noise reducing data for reducing the noise involved in the sensor output.

23. The CMOS sensing circuit in accordance with claim 16, wherein said signal generating means is for generating said intentional offset value which is larger than two times the signal quantity of said sensing objective signal.

24. The CMOS sensing circuit in accordance with claim 16, wherein said signal generating means is for generating said intentional offset value which is equal to or larger than ten times a maximum value of the signal quantity of said sensing objective signal.

25. The CMOS sensing circuit in accordance with claim 16, wherein said signal generating means is for generating said intentional offset value which is equal to or larger than the quantity of the noise to be removed.

26. The CMOS sensing circuit in accordance with claim 16, wherein an input circuit is provided for converting said sensing objective signal into a form suitable for the measuring operation performed by said measuring means, and said signal generating means is provided independent of said input circuit.

27. The CMOS sensing circuit in accordance with claim 16, wherein said measuring means is for measuring signal quantities of a plurality of sensing objective signals, and the measuring operation for obtaining said measured intentional offset value and the measuring operations for obtaining measured signal values corresponding to said plurality of sensing objective signals are performed in predetermined order so as to minimize an average of time intervals between said measuring operation for obtaining said measured intentional offset value and the measuring operations for obtaining respective measured signal values.

28. The CMOS sensing circuit in accordance with claim 16, wherein said measuring means is for measuring signal quantities of a plurality of sensing objective signals, and the measuring operation for obtaining said measured intentional offset value and the measuring operations for obtaining measured signal values corresponding to said plurality of sensing objective signals are performed in predetermined order so as to minimize a time interval between said measuring operation for obtaining said measured intentional offset value and the measuring operation for obtaining a measured signal value corresponding to a specific sensing objective signal giving the largest influence to the sensing accuracy.

29. The CMOS sensing circuit in accordance with claim 16, wherein an input circuit is provided for converting said intentional offset value into a voltage signal having a level representing the quantity of said intentional offset value and also for converting a sum of said sensing objective signal and said intentional offset value into a voltage signal having a level representing the summed-up quantities of said sensing objective signal and said intentional offset value, and said measuring means includes a ring-gate delay circuit which comprises a plurality of inverting circuits connected in a ring pattern and having an inverting operation time varying in accordance with a power supply voltage, said power supply voltage being each voltage signal given from said input circuit, and said measuring means serves as an A/D conversion circuit for converting said measured intentional offset value and said sum of said sensing objective signal and said intentional offset value into corresponding digital data based on a pulse signal circulation frequency when a pulse signal is entered into said ring-gate delay circuit.

30. A noise removing method characterized by the steps of:

converting a sensing objective signal into digital data to obtain sensing data;

converting a referential objective value into digital data to obtain referential objective data;

setting an intentional offset data larger than said sensing data;

adding said intentional offset data to said sensing data to obtain a measured signal value;

adding said intentional offset data to said referential objective data to obtain a measured intentional offset value; and obtaining a ratio of said measured signal value to said measured intentional offset value as correction result to be used for reducing the noise involved in a sensor output.

31. The noise removing method in accordance with claim 30, wherein said sensing data and said referential objective data comprises noise data.

32. The noise removing method in accordance with claim 31, wherein said noise data is an A/D conversion value of a noise component involved in each of said sensing objective signal and said referential objective value, and said noise component is equivalent to or larger than the resolution in the A/D conversion.

33. The noise removing method in accordance with claim 32, wherein said noise component and said resolution of the A/D conversion are in a level of $\mu V$.

34. The noise removing method in accordance with claim 32, wherein said noise component is a frequency noise component proportional to 1/f and $(1/f)^n$ where $n \geq 1$ and "f" is a noise frequency not larger than 10 Hz.

35. The noise removing method in accordance with claim 31, wherein said noise data is an A/D conversion value of a noise component which is added to each of said sensing objective signal and said referential objective value when said sensing objective signal and said referential objective value are amplified by an amplification circuit using a transistor.

36. The noise removing method in accordance with claim 30, wherein said referential objective data is equivalent to an A/D conversion value obtained when said sensing objective signal is substantially 0.

37. The noise removing method in accordance with claim 30, wherein said referential objective data is equivalent to an A/D conversion value obtained when said sensing objective signal is substantially 50% of its maximum value.

38. The noise removing method in accordance with claim 30, wherein said intentional offset data is larger than said sensing data.

* * * * *